United States Patent [19]

Fan et al.

[11] Patent Number: 5,453,405
[45] Date of Patent: Sep. 26, 1995

[54] METHOD OF MAKING LIGHT EMITTING DIODE BARS AND ARRAYS

[75] Inventors: John C. C. Fan, Chestnut Hill; Brenda Dingle, Mansfield; Shambhu Shastry, Franklin; Mark B. Spitzer, Sharon; Robert W. McClelland, Norwell, all of Mass.

[73] Assignee: Kopin Corporation, Taunton, Mass.

[21] Appl. No.: 165,025

[22] Filed: Dec. 9, 1993

Related U.S. Application Data

[62] Division of Ser. No. 643,552, Jan. 18, 1991, Pat. No. 5,300, 788.

[51] Int. Cl.⁶ .................................................. H01L 21/465
[52] U.S. Cl. ............................ 437/228; 437/23; 437/90; 437/127; 437/130; 437/133; 437/908; 148/100
[58] Field of Search ........................ 437/23, 71, 90–92, 437/127, 129, 130, 133, 228, 908; 148/DIG. 99, DIG. 100, DIG. 101, DIG. 12

[56] References Cited

U.S. PATENT DOCUMENTS

| | | | |
|---|---|---|---|
| 4,142,925 | 3/1979 | King et al. | 148/DIG. 135 |
| 4,575,854 | 3/1986 | Martin | 371/75 |
| 4,727,047 | 2/1988 | Bozler et al. | 437/89 |
| 4,769,680 | 9/1988 | Resor, III et al. | 355/43 |
| 4,774,205 | 9/1988 | Choi et al. | 437/36 |
| 4,846,931 | 6/1989 | Gmitter et al. | 156/633 |
| 4,855,255 | 8/1989 | Goodhue | 437/129 |
| 4,863,877 | 9/1989 | Fan et al. | 437/22 |
| 4,883,561 | 11/1989 | Gmitter et al. | 156/633 |
| 4,979,002 | 12/1990 | Pankove | 357/17 |
| 5,045,895 | 9/1991 | Yoshida et al. | 357/17 |
| 5,073,806 | 12/1991 | Idei | 357/17 |
| 5,091,757 | 2/1992 | Yoshida | 357/17 |
| 5,115,335 | 5/1992 | Soref | 559/248 |
| 5,145,809 | 8/1992 | Walker | 148/DIG. 135 |
| 5,286,335 | 2/1994 | Drabik et al. | 148/DIG. 100 |

FOREIGN PATENT DOCUMENTS

| | | |
|---|---|---|
| 54-93378 | 7/1979 | Japan . |
| 57-106181 | 7/1982 | Japan . |
| 1-259580 | 10/1989 | Japan . |
| 90/09038 | 8/1990 | WIPO . |
| 91/02380 | 2/1991 | WIPO . |

OTHER PUBLICATIONS

A. G. Milnes, "Semiconductor Heterojunction Topics: Introduction and Overview," *Solid–State Electronics*, 29 (2):99–121 (1986).

M. Akiyama et al. "Growth of FaAs on Si and Its Application to FETS and LEDS" Mat. Res. Soc. Symp. Proc. 67 (1986):53–64.

G. W. Turner et al. "High–Speed Photocoductive Detectors Fabricated in Heteroepitxial GaAs layers" Mat. Res. Soc. Symp. Proc 67 (1986):181–188.

D. L. McDaniel, Jr. et al. "Vertical Cavity Surface–Emitting Semiconductor Laser With CW Injection Laser Pumping" IEEE Phtonics Tech. Ltrs 2(3):156–158 (Mar. 1990).

J. P. Weber et al. "Effects Of layer Thickness Variations on Vertial–Cavity Surface–Emitting DBR Semiconductor Lasers" IEEE Photonics Tech. Ltrs 2(3):162–164 (Mar. 1990).

"Two–Dimensional Optoelectronic Device Arrays" *The Institute of Electrical Engineers*, Colloquim (21 Oct. 1991).

*Primary Examiner*—R. Bruce Breneman
*Assistant Examiner*—Ramamohan Rao Paladugu
*Attorney, Agent, or Firm*—Hamilton, Brook, Smith & Reynolds

[57] ABSTRACT

Light emitting diodes (LEDs) and LED bars and LED arrays formed of semiconductive material, such as III–V, and particularly AlGaAs/GaAs material, are formed in very thin structures using organometallic vapor deposition (OMCVD). Semiconductor p-n junctions are formed as deposited using carbon as the p-type impurity dopant. Various lift-off methods are described which permit back side processing when the growth substrate is removed and also enable device registration for LED bars and arrays to be maintained.

59 Claims, 17 Drawing Sheets

FIG. 7a
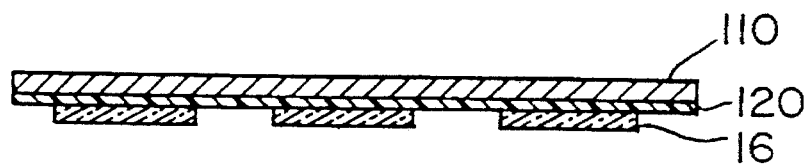
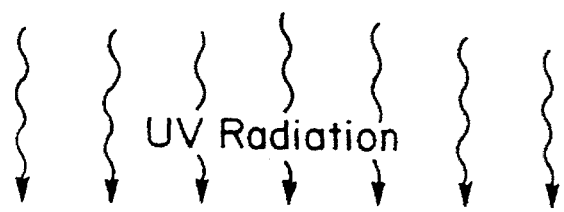
FIG. 7b
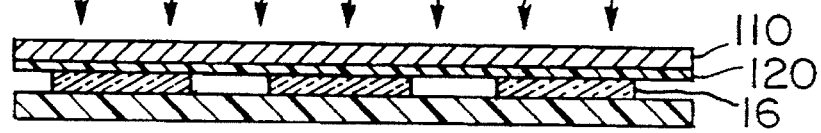
⟨or⟩
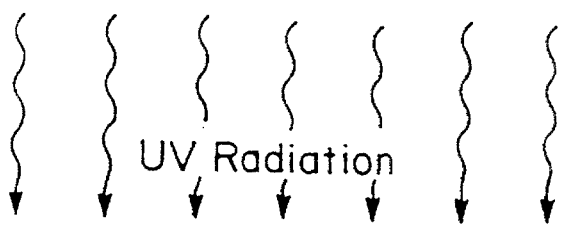
FIG. 7c
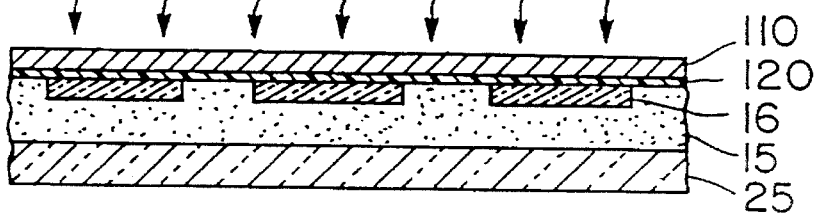

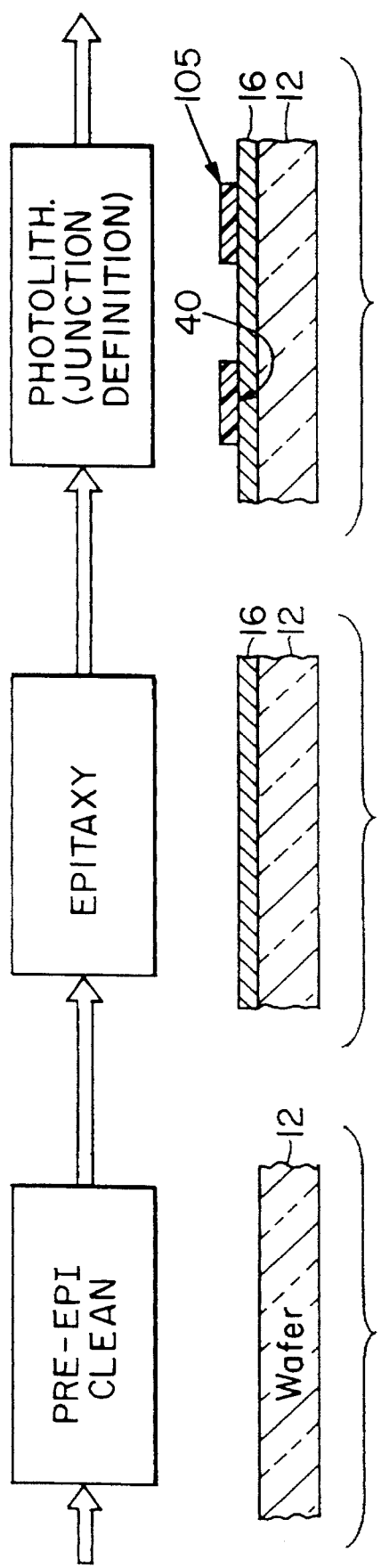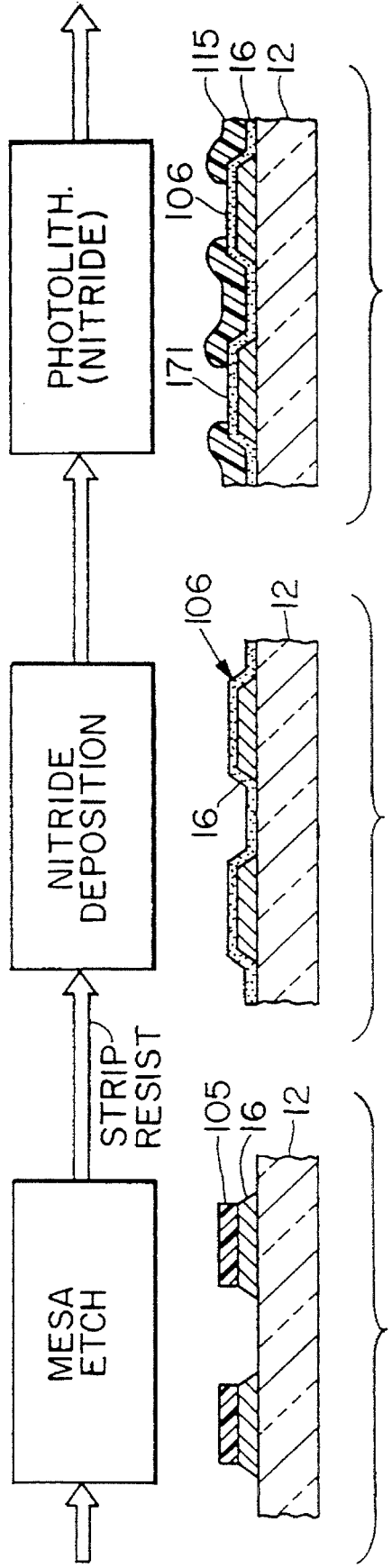

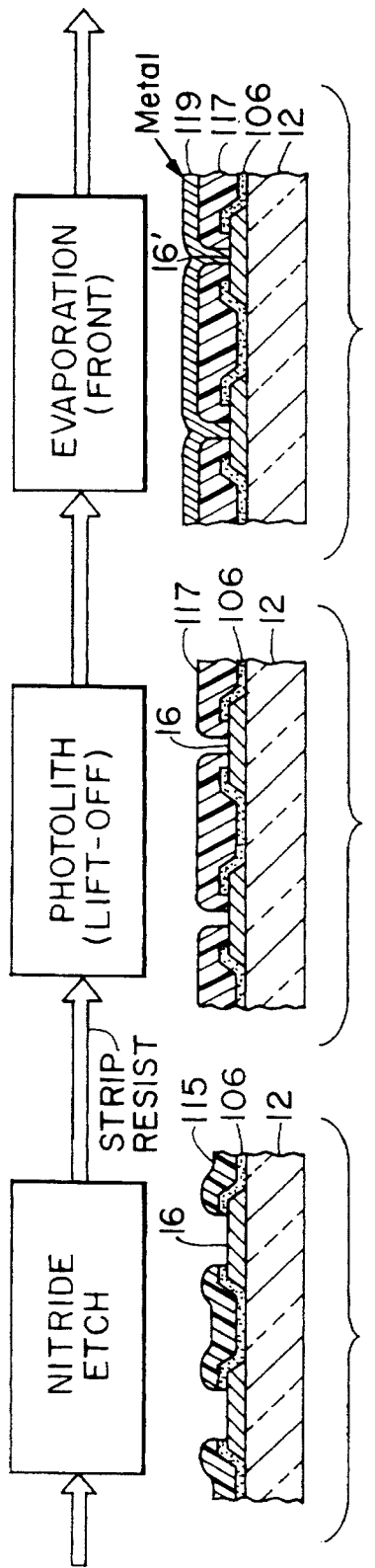
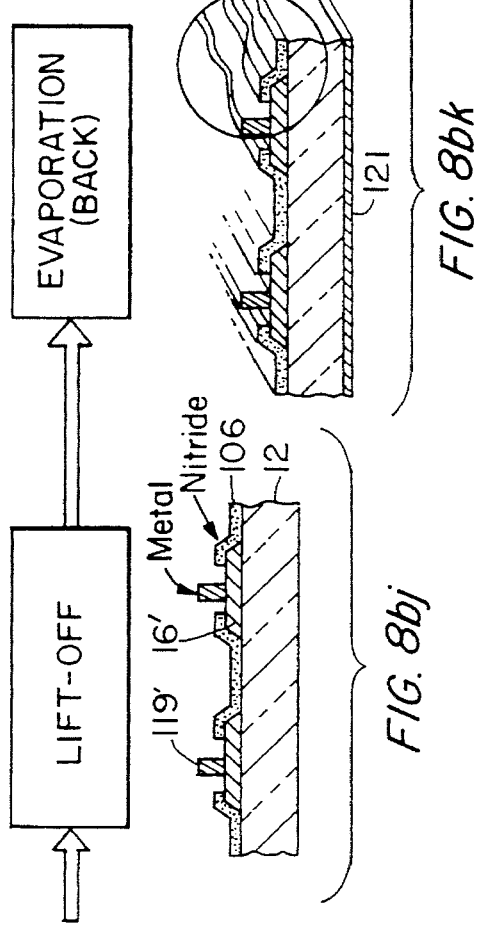
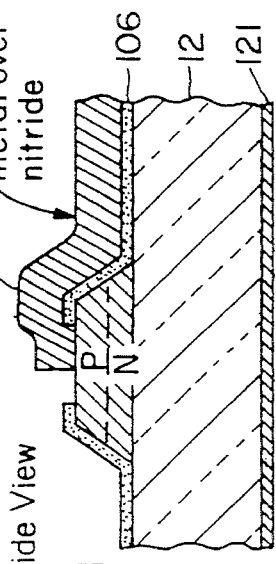
FIG. 9

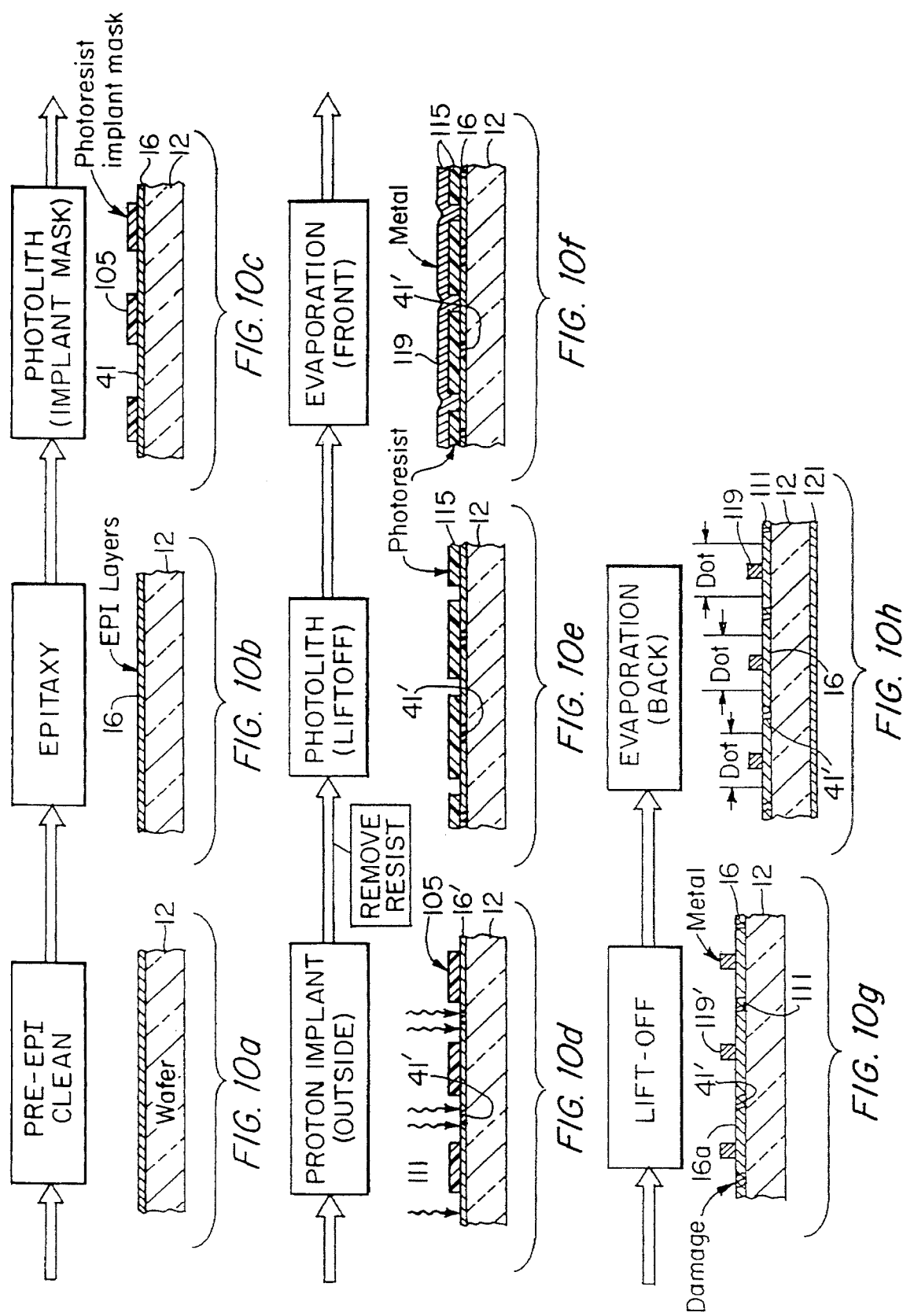

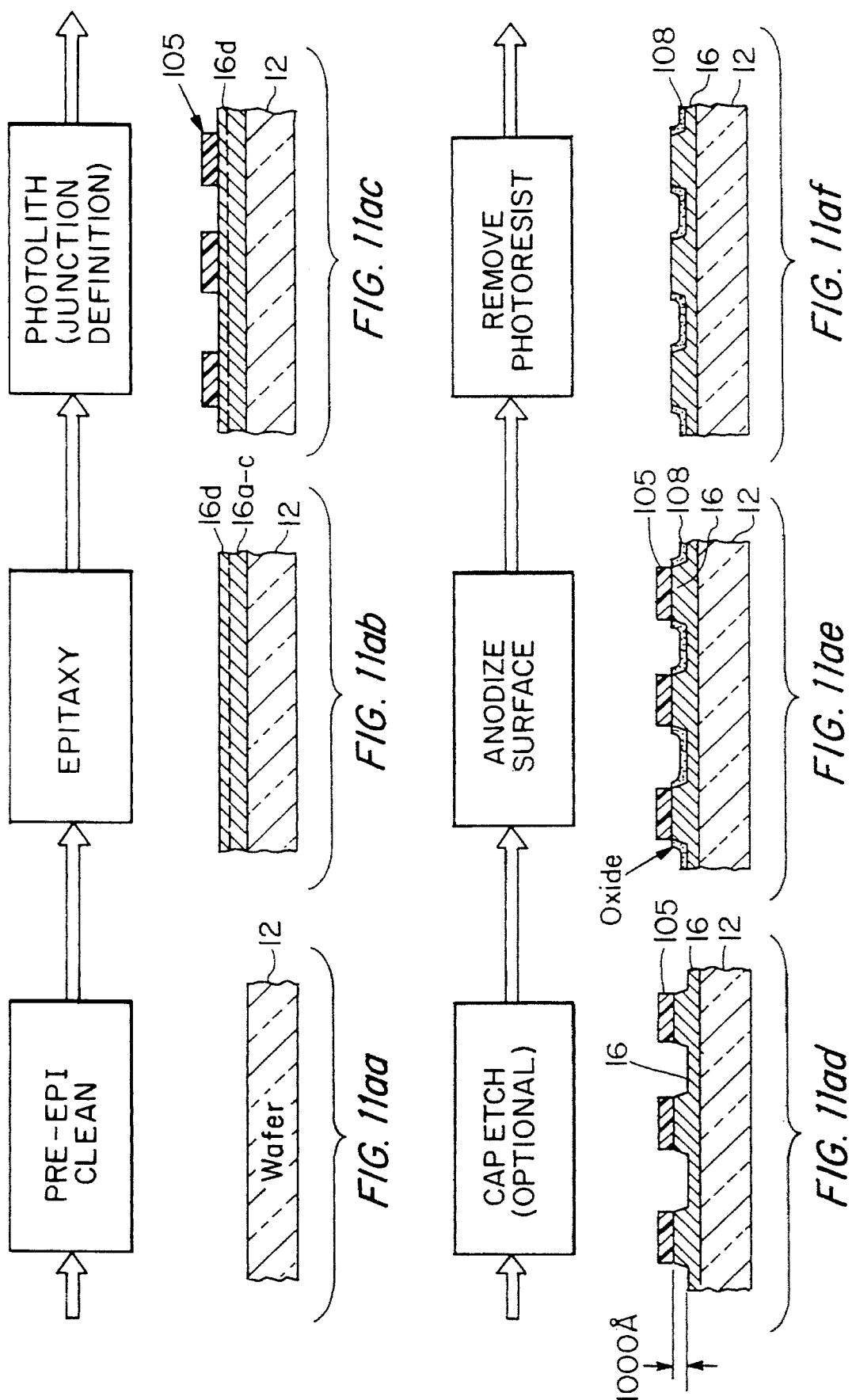

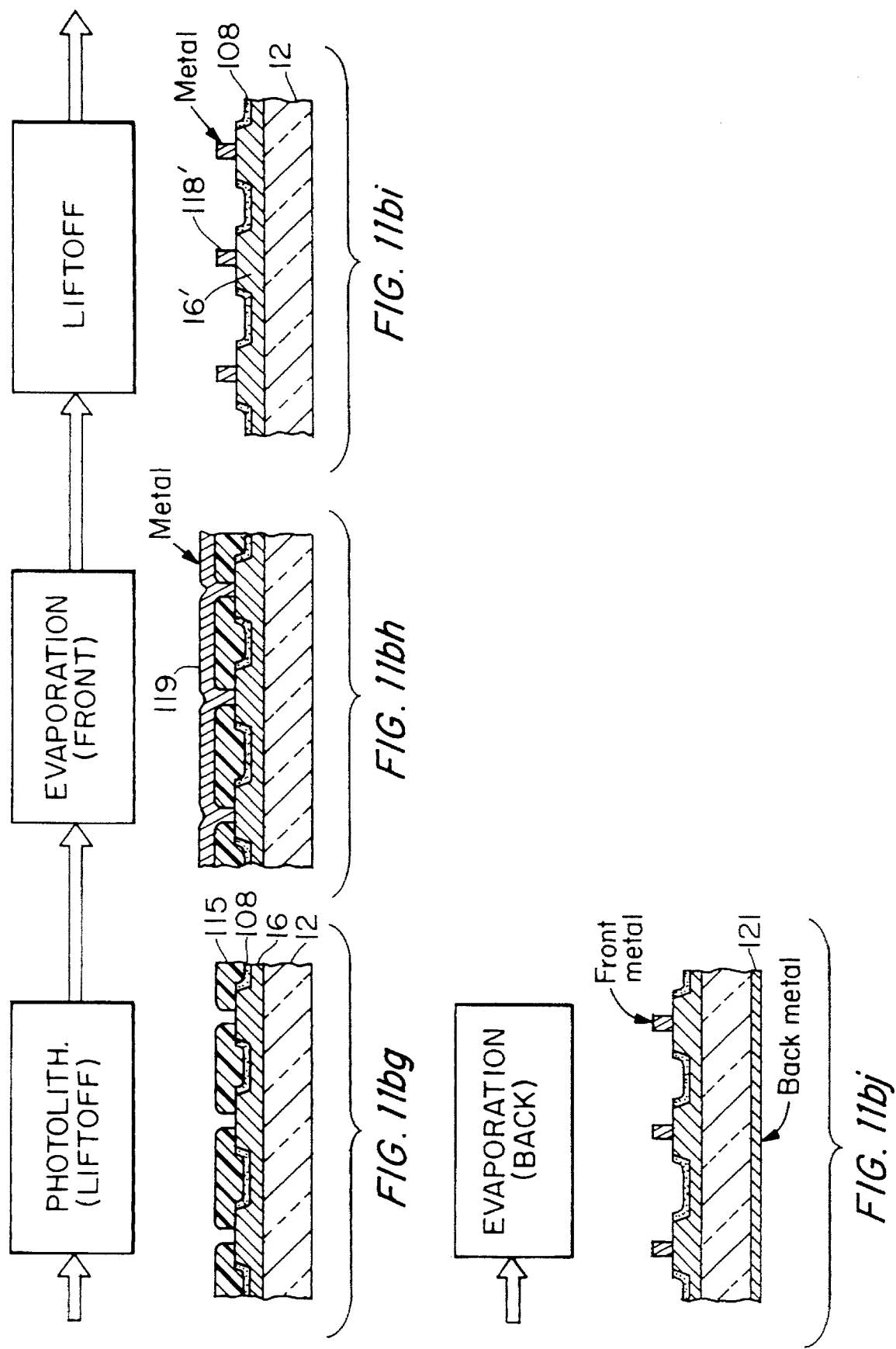

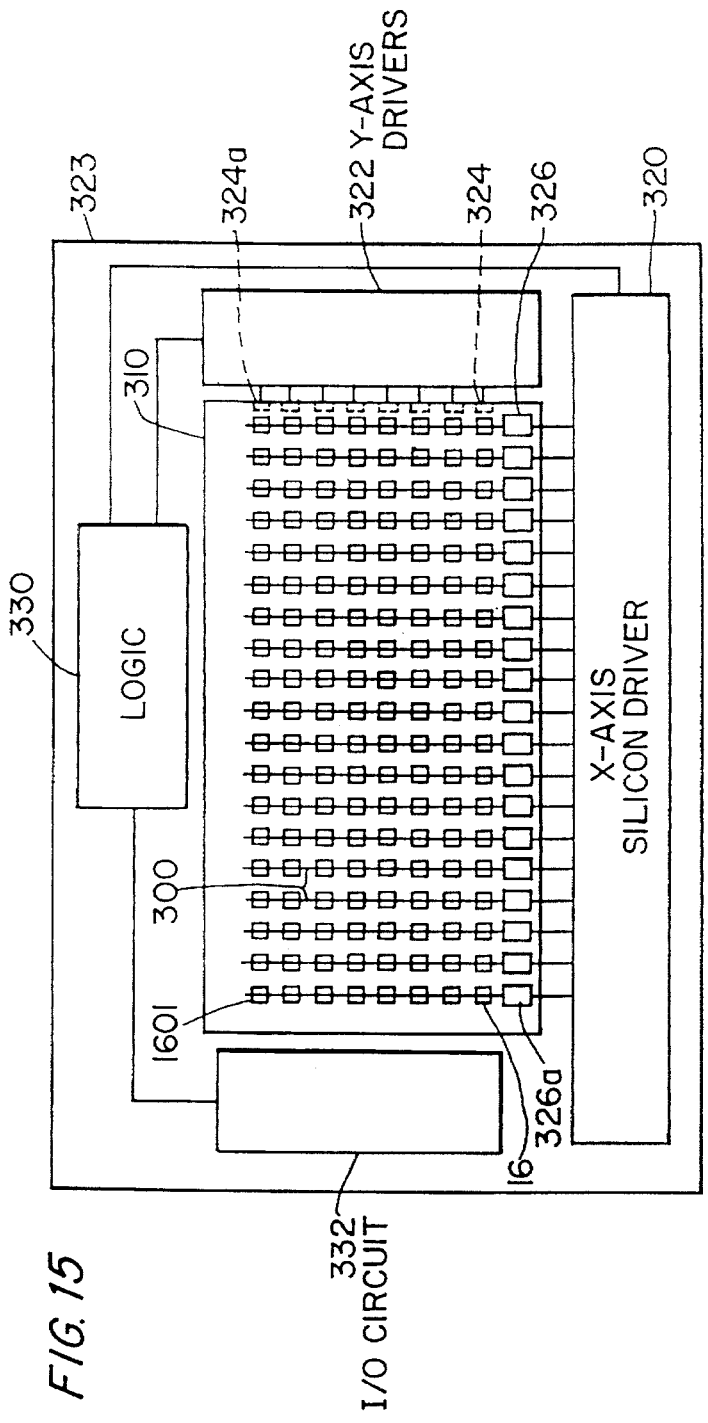
FIG. 15
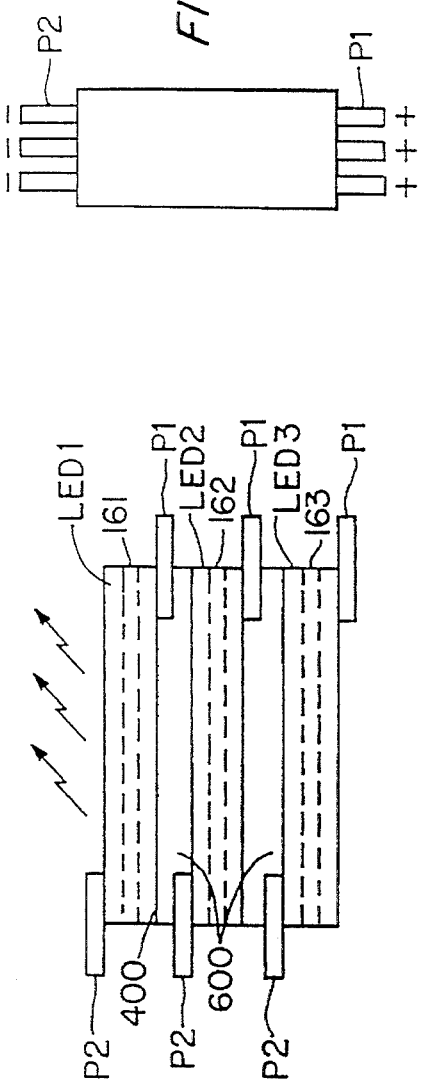
FIG. 17
FIG. 16

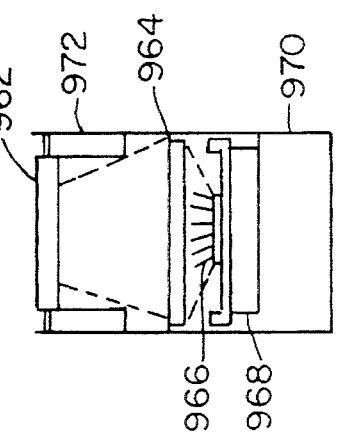
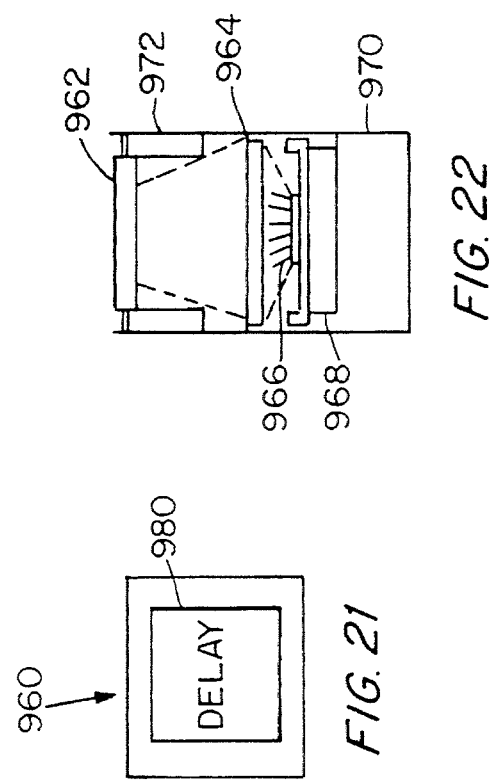
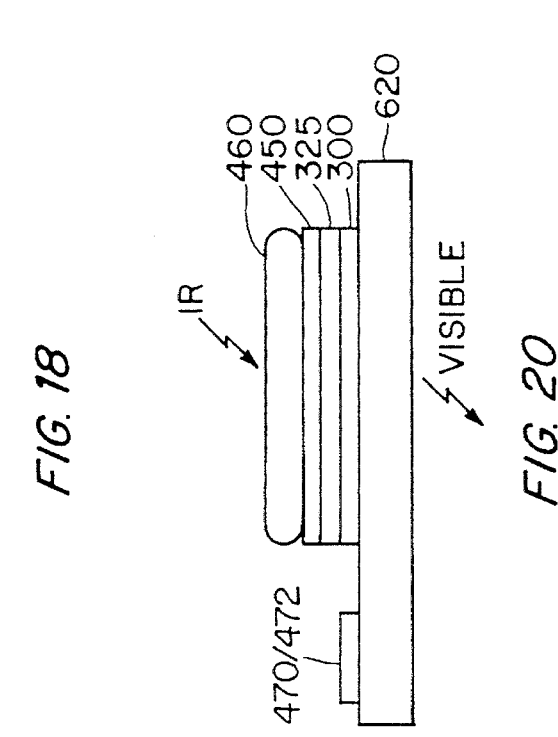
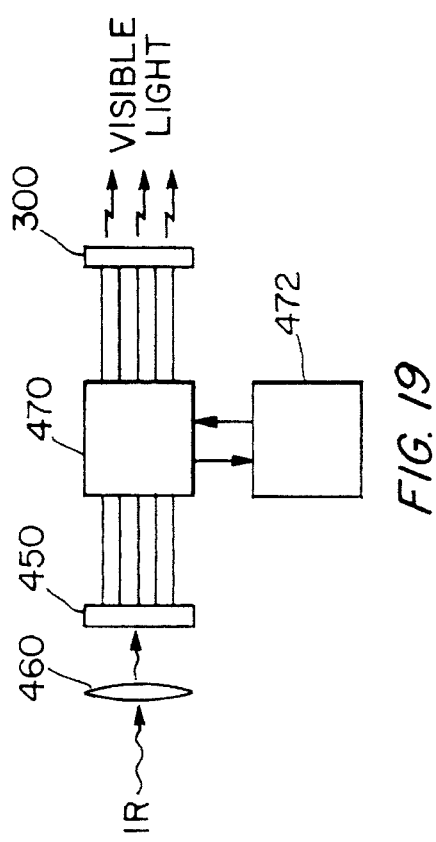
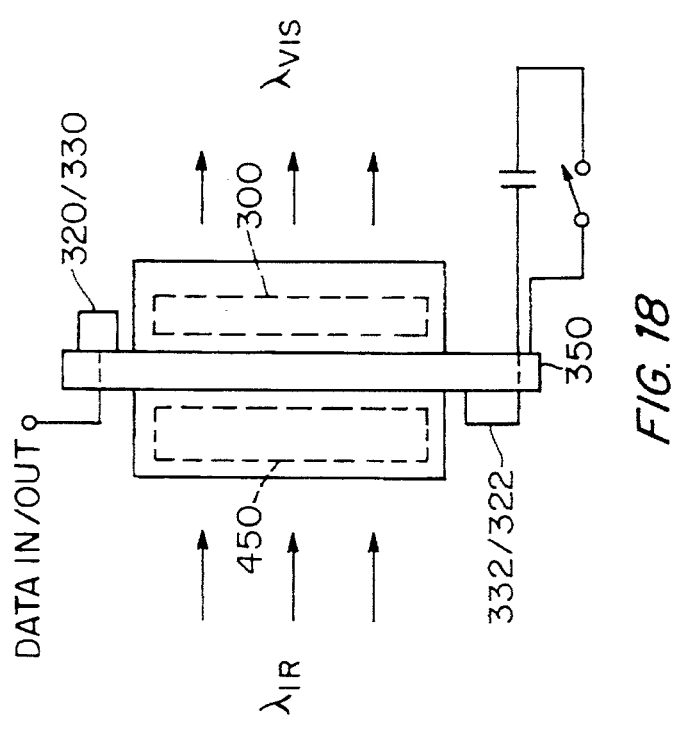

METHOD OF MAKING LIGHT EMITTING DIODE BARS AND ARRAYS

This application is a division of application 07/643,552 filed on Jan. 18, 1991 now U.S. Pat. No. 5,300,788.

TECHNICAL FIELD

This invention is in the field of light emitting diodes (LEDs).

BACKGROUND OF THE INVENTION

The background to the invention may be conveniently summarized in connection with four main subject matters: LEDs, LED bars, LED arrays and Lift-off methods, as follows:

LEDs

LEDs are rectifying semiconductor devices which convert electric energy into non-coherent electromagnetic radiation. The wavelength of the radiation currently extends from the visible to the near infrared, depending upon the bandgap of the semiconductor material used.

Homojunction LEDs operate as follows: For a zero-biased p-n junction in thermal equilibrium, a built-in potential at the junction prevents the majority charge carriers (electrons on the n side and holes on the p side) from diffusing into the opposite side of the junction. Under forward bias, the magnitude of the potential barrier is reduced. As a result, some of the free electrons on the n-side and some of the free holes on the p-side are allowed to diffuse across the junction. Once across, they significantly increase the minority carrier concentrations. The excess carriers then recombine with the majority carrier concentrations. This action tends to return the minority carrier concentrations to their equilibrium values. As a consequence of the recombination of electrons and holes, photons are emitted from within the semiconductor. The energy of the released photons is close in value to that of the energy gap of the semiconductor of which the p-n junction is made. For conversion between photon energy (E) and wavelength ($\lambda$), the following equation applies:

$$E(eV) = \frac{1.2398}{\lambda} \; (\mu m)$$

The optical radiation generated by the above process is called electroluminescence. The quantum efficiency $\eta$ for a LED is generally defined as the ratio of the number of photons produced to the number of electrons passing through the diode. The internal quantum efficiency $\eta_i$ is evaluated at the p-n junction, whereas the external quantum efficiency $\eta_e$ is evaluated at the exterior of the diode. The external quantum efficiency is always less than the internal quantum efficiency due to optical losses that occur before the photons escape from the emitting surface. Some major causes for the optical losses include internal re-absorption and absorption at the surface. The internal efficiency can exceed 50% and, sometimes, can be close to 100% for devices made of a very high-quality eptaxial material. The external quantum efficiency for a conventional LED is much lower than the internal quantum efficiency, even under optimum conditions.

Most commercial LEDs, both visible and infrared, are fabricated from group III–V compounds. These compounds contain elements such as gallium, indium and aluminum of group III and antimony, arsenic and phosphorus of group V of the periodic table. With the addition of the proper impurities, by diffusion, or grown-in; III–V compounds can be made p- or n-type, to form p-n junctions. They also possess the proper range of band gaps to produce radiation of the required wavelength and efficiency in the conversion of electric energy to radiation. The fabrication of LEDs begins with the preparation of single-crystal substrates usually made of gallium arsenide, about 250–350 μm thick. Both p- and n-type layers are formed over this substrate by depositing layers of semiconductor material from a vapor or from a melt.

The most commonly used LED is the red light-emitting diode, made of gallium arsenide-phosphide on gallium arsenide substrates. An n-type layer is grown over the substrate by vapor-phase deposition followed by a diffusion step to form the p-n junction. Ohmic contacts are made by evaporating metallic layers to both n- and p-type materials. The light resulting from optical recombination of electrons and holes is generated near the p-n junction. This light is characterized by a uniform angular distribution; some of this light propagates toward the front surfaces of the semiconductor diode. Only a small fraction of the light striking the top surface of the diode is at the proper angle of incidence with respect to the surface for transmission beyond the surface due to the large difference in the refractive indices between semiconductor and air. Most of the light is internally reflected and absorbed by the substrate. Hence a typical red LED has only a few percent external quantum efficiency, that is, only a few percent of the electric energy results in external light emission. More efficient and therefore brighter LEDs can be fabricated on a gallium phosphide substrate, which is transparent to the electroluminescent radiation and permits the light to escape upon reflection from the back contact. For brighter LEDs, AlGaAs, with the Al percentage equal to 0–38%, grown on GaAs substrates is used. The AlGAs LEDs are usually about 50 μm thick and are grown on GaAs by liquid-phase epitaxy(LPE). The p-n junctions are diffused. For even brighter LEDs, the AlGAs layers are grown even thicker (~150 μm), and the GaAs substrates are etched off. The thick AlGAs layer becomes the mechanical support. With no substrate and a reflector at the back side one can double the external efficiency.

Visible LEDs are used as solid-state indicator lights and as light sources for numeric and alphanumeric displays. Infrared LEDs are used in optoisolators, remote controls and in optical fiber transmission in order to obtain the highest possible efficiency.

The advantages of LEDs as light sources are their small size, ruggedness, low operating temperature, long life, and compatibility with silicon integrated circuits. They are widely used as status indicators in instruments, cameras, appliances, dashboards, computer terminals, and so forth, and as nighttime illuminators for instrument panels and telephone dials. Visible LEDs are made from III–V compounds. Red, orange, yellow and green LEDs are commercially available. Blue LEDs may be formed of II–VI materials such as ZnSe, or ZnSSe, or from SiC.

LEDs can also be employed to light up a segment of a large numeric display, used for example, on alarm clocks. A small numeric display with seven LEDs can be formed on a single substrate, as commonly used on watches and hand-held calculators. One of the major challenge for LEDs is to make very efficient LEDs, with high external efficiency.

LED Bars

A linear, one-dimensional array of LEDs can be formed from a linear series of sub-arrays, wherein the sub-arrays comprise a semiconductor die with several hundred microscopic LEDs. Each LED is separately addressable and has its own bond pad. Such a die is referred to as an LED bar and the individual LEDs in the array are referred to as "dots" or "pixels".

LED bars are envisioned as a replacement for lasers in laser-printer applications. In a laser printer, the laser is scanned across a rotating drum in order to sensitize the drum to the desired pattern, which is then transferred to paper. The use of electronically scanned LED bars for this purpose can result in replacement of the scanning laser with a linear stationary array of microscopic LEDs that are triggered so as to provide the same optical information to the drum, but with fewer moving parts and possibly less expensive electro-optics.

Currently, commercial LED bars are of two types: GaAsP on GaAs substrates and GaAlAs on GaAs. The GaAsP/GaAs bars are grown by Vapor Phase Epitaxy (VPE). Because of the lattice mismatch between GaAsP and GaAs, thick GaAsP layers must be grown of about 50 microns or more thickness and growth time per deposition run is long (5–6 hours). LED bars produced in this fashion are not very efficient and consume much power, and have relatively slow response times.

The second type of LED bar, i.e., GaAlAs/GaAs is grown by Liquid Phase Epitaxy (LPE). LPE growth is cumbersome and does not lead to smooth growth, or thin uniform layers, and is not well suited to the growth of complex structures requiring layers of different III–V compositions.

One of the most important performance requirements for LED bars is dot-to-dot uniformity of the optical output or electroluminescence (or $\eta\epsilon$). Uniformity of 10 to 15% is currently typical but the marketplace desires ±2% or better. Another major requirement is output stability over the lifetime of the LED bar. Currently stability is poor. Another important feature is high brightness, which is presently not very good. Elimination of wire bonding which is currently not available is also highly desirable. Thermal sinking is also important, particularly in the case of inefficient GaAsP bars, in which the brightness is dependent upon operating temperature.

LED Arrays

Currently, arrays of LEDs, addressable in two directions (i.e., an X-Y array or X-Y matrix), have been formed of discrete LED chips mounted on printed circuit boards. The resolution of such arrays is limited by the pixel size which is on the order of 200 microns square.

An alternate approach has been to use LED bars to project the light on scanning mirrors. The inclusion of moving parts causes life and speed limitations.

A need exists, therefore, for a monolithic X-Y addressable array with high resolution properties.

Lift-off Methods

In the fabrication of LEDs, LED bars and LED arrays, it is desirable for a number of reasons, chiefly relating to quantum output efficiency, to utilize thin film epitaxial semiconductor layers for device fabrication. Furthermore, as stated in U.S. Pat. No. 4,883,561 issued Nov. 28, 1989 to Gmitter et al.:

"In thin film technology there has always been a tradeoff between the material quality of the film and the ease of depositing that thin film. Epitaxial films represent the highest level of quality, but they must be grown on and area accompanied by cumbersome, expensive, bulk single crystal wafer substrates. For some time, research has focused on the possibility of creating epitaxial quality thin films on arbitrary substrates while maintaining the ultimate in crystalline perfection.

The main approach has been to attempt to reuse the substrate wafer by separating it from the epitaxially grown film; however, to undercut a very thin film over its entire area without adversely affecting the film or the underlying substrate, the selectivity must be extremely high. This is very difficult to achieve. For example, J. C. Fan has described in Journale de Physique, re, Cl. 327 (1982) a process in which an epitaxial film is cleaved away from the substrate on which it is grown. Such cleavage, at best, is difficult to achieve without damage to the film and/or substrate, or without removal of part of the substrate. Also, in some instances, the cleavage plane (<110>) and the growth plane (<110>) of the film may be mutually exclusive.

In a paper by Konagai et al. appearing in J. of Crystal Growth 45, 277–280 (1978) it was shown that a Zn doped p-$Ga_{1-x}Al_xAs$ layer can be selectively etched from GaAs with HF. This observation was employed in the production of thin film solar cells by the following techniques. In one technique, zinc doped p-$Ga_{1-x}Al_xAs$ was grown by liquid phase epitaxy (LPE) on a n-GaAs grown layer on a GaAs single crystal substrate. During this LPE growth of the Zn doped $Ga_{1-x}Al_xAs$, Zn diffuses into the surface of the underlying GaAs to form a p-type GaAs layer and hence p-n GaAs junction. The surface p-$Ga_{1-x}Al_xAs$ is then selectively etched away leaving the p-n junction GaAs layers on the GaAs substrate.

In another solar cell fabrication process Konagai et al describe a "peeled film technology," which will be referred to here as lift-off technology. A 5 micron thick $Ga_{0.3}Al_{0.7}As$ film is epitaxially grown on a GaAs <111> substrate by LPE. A 30 micron thick Sn doped n-GaAs layer is then grown over the $Ga_{0.3}Al_{0.7}As$ layer and a p-n junction is formed by diffusing Zn into the specimen utilizing $ZnAs_2$ as the source of Zn. Appropriate electrical contacts are then formed on the films using known photoresist, etch and plating techniques. The surface layer is then covered with a black wax film support layer and the wafer is soaked in an aqueous HF etchant solution. The etchant selectively dissolves the $Ga_{0.3}Al_{0.7}As$ layer which lies between the thin solar cell p-n junction device layers and the underlying substrate, allowing the solar cell attached to the wax to be lifted off the GaAs substrate for placement on an aluminum substrate. The wax provides support for the lifted off film.

While the technique described above has been described in the literature for over ten years, it was not adopted by the industry. One reason for this was a difficulty encountered in completely undercutting the $Ga_{0.3}Al_{0.7}As$ 'release' layer in a reasonable time, especially when the area of the film to be lifted-off was large. This difficulty arose due to the formation and entrapment of gas formed as a reaction product of the etching process, within the etched channel. The gas created a bubble in the channel preventing or diminishing further etching and causing cracking in the epitaxial film. The problem could only be partially obviated by using very slow reaction rates (very dilute HF solutions). Since both the time required for lift-off and the risk of damage to the overlying film are important, the process was virtually abandoned."

In the Gmitter et al. patent, a lift-off approach was used which comprised selectively etching away a thin release layer positioned between an epitaxial film and the substrate upon which it grows, while causing edges of the epitaxial film to curl upward as the release layer is etched away, thereby providing means for the escape and outdiffusion of the reaction products of the etching process from the area between the film and substrate.

The Gmitter et al. process uses Apiezon (black) wax applied to the front side layer to be separated. The stress in the wax imparts a curvature to the layer being separated or lifted, thereby allowing etching fluid access to the etching front. This process is inherently limited to relatively small areas. The etching front must commence from the outer edge of the total area being lifted off. This results in long lift-off times, for example, up to 24 hours for a 2 cm² area.

In addition, the curvature necessary for lift-off is caused by a low temperature wax so that no high temperature processing can be done on the backside of the lifted area. This results from the fragile nature of the thin film which must be supported at all times. The film, when supported by the wax on the front side, is curved and cannot be further processed in that shape, without a great deal of difficulty. If the wax is dissolved to allow the film to lay flat, the film must first be transferred to a support by applying the backside surface to a support, in which case, access to the backside is no longer feasible without a further transfer. Presently, samples are cleaved to size, which precludes substrate reuse in full wafer form. Thus, this process is useful only for individual small areas that do not require backside processing. More importantly, there is no known method of registration from one lifted-off area to another. Thus, large scale processing for LED bars and LED arrays using this technique is not presently practical.

SUMMARY OF THE INVENTION

The invention is directed to novel LEDs and LED bars and arrays, per se. The present invention is also directed to a new and improved lift-off method and to LEDs, LED bars and LED arrays made by such method.

Lift-off Methods

In one embodiment of the novel lift-off method, a thin release layer is positioned between an epitaxial film and the substrate upon which it is grown. A coating of materials having different coefficients of expansion is applied on the epitaxial film layers. The top structure comprising the coating and the epitaxial layers is then patterned as desired to increase the amount of etchant front by cutting channels to completely laterally separate individual lift-off areas or by cutting slits part way into the epitaxial film.

The entire structure is then brought to a suitable temperature which causes thermal stress between the coating compositions while the structure is subjected to a release etchant resulting in lift-off of individual thin film areas supported by the coating.

Where registration between film areas is desired, such as in the fabrication of LED bars or LED arrays, a coating of material, such as uncured UV epoxy, which is capable of being transformed from a more readily soluble state to a less soluble state by UV radiation is applied over a thin film epilayer formed on a release layer over a substrate. A UV light transparent grid with a plurality of openings is affixed over the transformable coating.

A photomask, with an opaque pattern to cover the openings in the grid, is affixed over the grid. The transformable coating is cured everywhere except beneath the covered openings by exposing the layer to UV light through the photomask.

The mask is then removed. The uncured portions, i.e., in the openings of the grid are then removed by a solvent down to the epitaxial surface leaving a cured grid layer of epoxy over the thin film surface.

Next, the epitaxial layer is etched away down to the release layer using the openings in the grid to create access for the etchant at the many points across the structure.

The thin film layer may then be lifted off while attached to the support grid of remaining cured transformable material. The backside may then be processed on the wafer (substrate) scale with the wafer registration still retained.

In one of several alternative lift-off embodiments, release and registration is accomplished by forming channels between device areas directly on the thin film and thereby exposing areas of the release layer between lift-off areas. The exposed areas are then filled with etchant material. While the exposed areas are so filled, a lift-off support structure, such as UV curable epoxy tape, or other fairly rigid material, is affixed to the frontside of the wafer trapping the etchant in the channels. Eventually, the trapped etchant consumes enough release layer material to enable the lift-off support, together with the underlying lift-off areas, to be removed from the underlying substrate with registration intact.

LED and LED Bars

In accordance with the present invention, thin film epitaxial GaAs/AlGaAs LEDs and LED bars are formed by an Organo-Metallic-Chemical Vapor Deposition (OMCVD) lattice matched process. The p-n junctions are grown during OMCVD of an active GaAs layer which is sandwiched between AlGaAs cladding layers formed on a GaAs or Ge substrate. Preferably, carbon is used for the p-type dopant.

The cladding layers confine injected minority carriers to regions near the p-n junction.

A thin top surface of GaAs (light emitting surface) layer of about 1000 Å, or less, is formed to assist in current spreading at the pixel region. Current spreading is desired at the pixel region to provide uniform current through the p-n junction, but is undesirable beyond the pixel region where it would tend to cause a non-uniform pixel boundary, and for ease in contacting the device. The thin top surface layer also prevents oxidation of the AlGaAs cladding layer.

Various methods are employed to isolate the LED bar dots from each other and to preclude current spreading beyond the desired pixel boundary. One such method is ion or proton bombardment to destroy the crystal quality between dot regions and another is etch isolation through to the p-n junction between pixels. A simple but elegant alternate solution to the problem is to initially grow very thin cladding layers which serve the minority carrier confinement function near the p-n junction region, but are poor lateral conductors due to their thinness and thereby serve to prevent current spreading laterally.

By way of contrast, the currently known art uses a thick cladding layer to spread the current. Also, most LED bars use patterned Zn-diffused junctions to define the pixels. In that case, a thick top layer is used because the Zn diffuses quite deeply. This deep diffusion is useful for current spreading, but may not be easily controllable. In the present invention, which discloses grown epitaxial junctions, ion implantation, etching, or anodization may be used, as aforesaid, to create the high resistance region between pixels. A fourth approach, outlined above, uses a thin highly conductive patterned GaAs layer for current spreading to the pixel boundaries, and a thin and much less laterally conductive AlGaAs cladding layer. The thin GaAs layer (between 500 Å and 1000 Å, and preferably less than 1000 Å) transmits a large fraction of the light and conducts current to the edges of the pixel, provided the pixel size is not too much larger than 30 μm square. Thus, by patterning the GaAs, the current spreading is limited to the edge of the GaAs contact layer, and the cladding layer does not have to be patterned, leading to better planarity of the surface, and also avoiding the formation of exposed junction edges and associated deleterious perimeter leakage currents.

Optionally, the lift-off methods previously discussed may be employed to separate a front processed LED bar from its substrate, or the back surface of the substrate may simply be metallized to form a back contact for current flow.

LED Arrays

In accordance with the invention, LED arrays are formed on a suitable substrate comprising a III–V epitaxial heterojunction, preferably comprising AlGaAs cladding layers with a GaAs carbon coped p-n junction formed between the AlGaAs layers using the OMCVD process described above. Optionally, an etch stop or release layer is formed between the substrate and the epi-layers when it is desired to separate the substrate after front side processing.

A pattern of contact pads and bus bars is then formed on the top (or light emitting) surface. Next, each LED dot, or pixel, is isolated by etching part way through the epi-layers forming isolated dot mesas.

A planar support structure (preferably of light transparent material, such as glass) is then bonded to the top of the mesas by a suitable adhesive, such as light transparent epoxy.

After the support is attached, the substrate is etched off, or cleaved off, leaving the LED film patterned on one side (front side) with contact pads and bus bars attached to the support structure. The remaining side (called the backside) is exposed when the substrate is removed. The backside contacts (running orthogonal to the top side contacts) and bus bars are then formed by photolithography followed by electroplating or evaporation of the metal for the contact to form an LED array of LED pixels addressable in two orthogonal directions.

A multicolor array can be formed by two or more such arrays. In the multicolor embodiment, each array is formed with a different bandgap material to create light emissions of different wavelength and, hence, different colors. The larger bandgap material is formed closer to the top or light emitting surface. The material with the larger bandgap will be transparent to radiation from the smaller bandgap material.

A "smart" switch can be formed using an X-Y LED array, as described above. The LED array is mounted inside a light transparent pushbutton. The LED X-Y contacts are addressed by a microprocessor, so that a message can be displayed on the face of the button indicating, for example, the button function.

A digital multiplexed infrared (IR) and visible image converter/enhancement system can be formed using the previously described lift-off processes and backside processes to form X-Y arrays of photodetectors and X-Y LED arrays of very thin epi-layers with registered dots and metallization on both sides.

An image, focused on the X-Y detector array, is converted to an electrical signal by sequentially detecting the charge or current in each IR detector element. An X-Y photodetector array, formed as above, is coupled to a microprocessor controlled digital multiplexor comprising an array of transistor gates.

The detected signal is amplified and drives a corresponding visible light emitting dot or pixel in an LED array, resulting in conversion of the IR image to a visible light image. The pixel size can be as small as 25 microns or even less, depending on the wavelength of the light and up to the layer thickness, i.e., approximately 1 micron, resulting in very high resolution and fairly low cost.

The above summary will now be supplemented by a more complete description of the invention in the various embodiments described in connection with the following drawings.

BRIEF DESCRIPTION OF THE DRAWINGS

FIGS. 7a–7c are schematic sectional drawings of a last embodiment of the lift-off method of the invention.

FIGS. 8a–8b is a process flow diagram of the main steps in fabricating an LED bar in accordance with a mesa etch isolation process with a corresponding schematic sectional view of a wafer structure so processed shown beneath each step.

FIG. 9 is a cross-sectional side view of a wafer during step k of FIG. 8b.

FIG. 10 is a process flow diagram of the main steps in fabricating an LED bar in accordance with an alternate process with a corresponding schematic sectional view of a wafer structure so processed shown beneath each step.

FIGS. 11a–11b is a process flow diagram of the main steps in fabricating an LED bar in accordance with yet another alternate process with a corresponding schematic sectional view of a wafer structure so processed shown beneath each step.

FIG. 15 is a plan view of an X-Y addressable LED array mounted on a silicon substrate with associated silicon electronic circuitry.

FIG. 16 is a side view of a pixel of a tri-color X-Y addressable LED array.

FIG. 17 is a plan view of the array of FIG. 16.

FIG. 18 is a schematic side view of an IR to visible light converter embodiment of the invention.

FIG. 19 is a schematic diagram of the converter of FIG. 18.

FIG. 20 is a side view of an alternate embodiment of FIG. 18.

FIG. 21 is a top view of a "Smart" buttons embodiment in accordance with the invention.

FIG. 22 is a schematic side view of the button of FIG. 21.

DETAILED DESCRIPTION OF THE INVENTION

I. Lift-off Methods

A first embodiment of the invention will now be described in connection with item 10 of the cross-sectional drawings of FIGS. 1a–1f. A substrate 12, which may comprise any suitable substrate material upon which to grow epitaxial hetero-layers, is provided. A release layer 14 is grown, preferably by OMCVD, on substrate 14. Layer 14 is preferably formed of AlAs for an AlGaAs/GaAs device. For an InP device, an InGaAs release layer is preferred. AlAs is preferentially etched by HF acid, while InGaAs is preferentially etched by sulfurix/hydrogen peroxide and water solution.

Figure 1A:
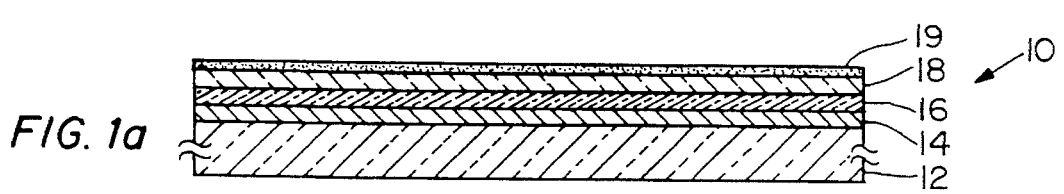
FIGS. 1a–1d are a series of schematic cross-sectional flow diagrams showing various steps in a first embodiment of a lift-off process of the invention.

There are a number of ways to achieve liftoff depending on whether large continuous sheets of material, discrete areas, or registered discrete areas are desired. The first liftoff embodiment is intended to improve upon the prior art for lifting off large continuous areas of material. In this case, curvature is needed to speed up the process. A coating 18 & 19 is formed on the front side processed LED structure 16 formed on a release layer 14 grown on substrate 12 (FIG. 1a). The coating may consist of a single film or combination of thick or thin film materials with various thermal coefficients of expansion. For example, coatings 18 & 19 may comprise a nitride, metal, bi-metal or coated thin glass. The stress in the coating can be tailored for the exact application to impart a controlled curvature to the thin film of material as it is released, thereby assisting the flow of etchant to the liftoff front.

The curvature can be tailored for use at room temperature, in which case it would need to be removed afterward for further processing without curvature, or it could be tailored to lie flat at room temperature, and to impart the compressive stress to the liftoff material at elevated or reduced temperature. In one example, a thin glass sample 18 can be coated with a layer of purposely stressed nitride 19, in order to put the glass under compression. Stress is induced by varying the rate of deposition and by depositing at a temperature which is different than the temperature at which the structure will be used. For example, the film materials may be sputter at low deposition temperatures. The glass can be coated after it is affixed to the front of the liftoff material (i.e. LED structure 16) or before. The coating is then patterned and the structure is then exposed to a release etchant such as, HCL, HF or $H_2SO_4/H_2O_2/H_2O$ using the coating layers 18/19 as a mask. Due to the stress, the glass 18 and thin film sandwich 16 will curve up as the material is released from it's rigid substrate, allowing the etchant access to the front, FIG. 1c. After complete liftoff, the nitride coating can be removed, allowing the sample to lay flat again, while still being supported by the glass for backside processing.

Figure 1B:
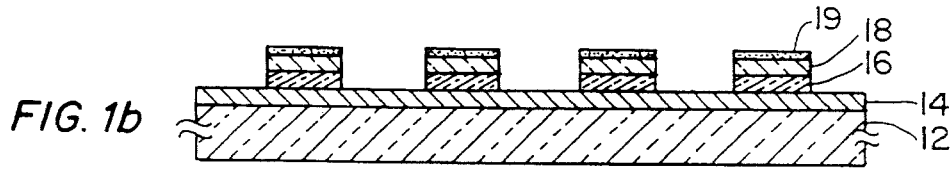
Figure 1C:
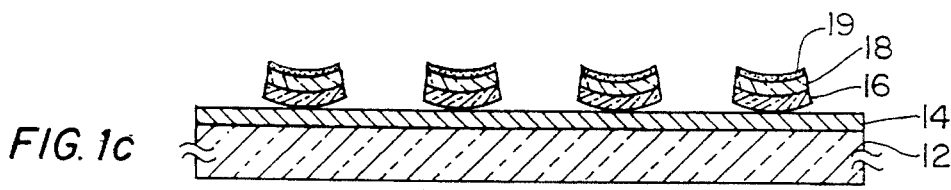

This process could also be applied for lifting off small area devices because although curvature is not necessary, it can still be beneficial in speeding up the release process. In this case, the coating layer 18 plus the LED structure 16 would simply be patterned in the desired configuration, FIG. 1b, using for instance well known photolithography techniques followed by wet etching, and subsequently removed down to the release layer 14 as seen in FIG. 1b.

An alternate liftoff process for lifting discrete devices will now be described in connection with FIGS. 2a and b, wherein corresponding items in FIG. 1 retain the same reference numeral in FIG. 2. By dividing the total wafer area into small areas, or equivalently, bringing the undercutting etchant in contact with many points across the wafer, the requirement for curvature is avoided. Areas as large as 0.5 cm wide have been shown to lift readily without curvature. As shown in the partial perspective cross-section of FIG. 2a, a substrate 12 has formed thereon a release layer 14, followed by an LED structure 16, as described in connection with FIG. 1. All front side processing, such as bonding pads and metal contacts (not shown) to the LED structure 16 are completed.

A state-transformable material, that is, a material which can be selectively transformed from one state to another state is formed on, or applied to, the front side processed LED structure 16. In the original state the transformable material may be substantially insoluble and when transformed may become soluble. The material is selectively transformed where desired and the material which is left in its original state is then removed. For example, a UV curable epoxy 30 may be spread over the structure 16. This epoxy has the property that exposure to intense UV light causes it to cure and become a solid. Uncured epoxy is soluble in solvents such as acetone and trichloroethylene while the cured epoxy is not. The epoxy is irradiated with UV light in the desired pattern using for instance a standard chrome photolithography mask 34 to block the light where curing is not desired. After exposure, the mask 34 is removed and the uncured epoxy is removed with a solvent such as trichloroethylene.

Next the LED structure 16 is removed down to the release layer 14. The cured epoxy 30 is left on the LED structure to serve as a support for the thin film LED structure 16 after separation from the substrate. In this manner, the etching front is increased by dividing up the total wafer area of structure 16 into smaller areas by cutting channels 40 down to the release layer 14. In this way, a whole wafer's worth of devices can be lifted in much shorter times than it would take to lift a continuous sheet of LED material from the same size wafer, and it is achieved without the need for curvature.

Where registration between LED devices separated from the same wafer is required, as in LED bars and arrays, the liftoff method of the alternate embodiment of FIGS. 3a–3d offers many advantages. Like numerals are used in FIGS. 3a–3d and subsequent figures for corresponding items in the previous figures.

This alternate process of FIG. 3 solves the difficult problem of trying to register small device or pixel areas of material with respect to each other, while at the same time, allowing the etching medium access to the exposed release layer. The ability to do this allows for easy retrieval from the solution, wafer scale processing on the backside, and short liftoff times due to the smaller areas and maximum etching front. This approach also enables registration of devices throughout the entire wafer area while still providing the etching solution access to many points across the wafer.

Figure 3A:
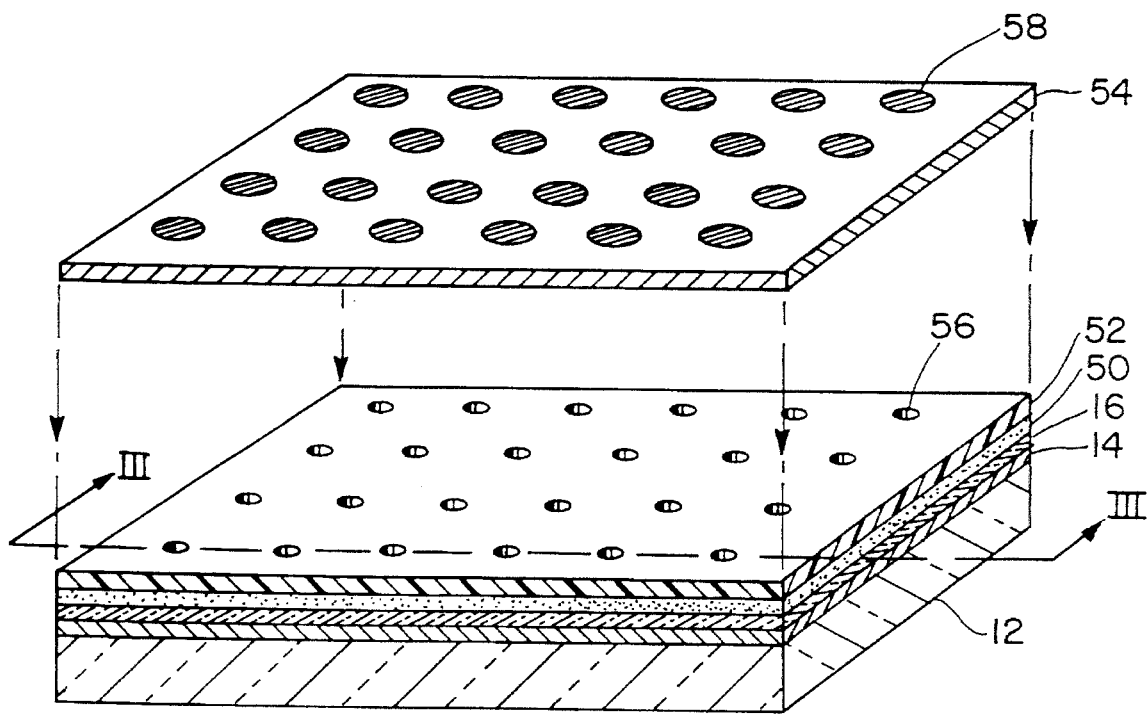
FIG. 3a is a partial perspective view of a portion of an LED wafer during lift-off processing in an alternate embodiment wherein registration is maintained.

Turning now to FIG. 3(a), there is shown a rectangular partial section of a conventional III–V planar circular 3 inch wafer. The wafer is formed of a semiconductor substrate 12 upon which a release layer 14 is deposited by OMCVD followed by a front processed LED structure 16, all as previously described above.

Transformable material, such as uncured liquid UV epoxy 50 is spread onto the top or front surface of structure 16. The point of departure with the previous embodiment occurs in the next step, when a perforated planar grid 52, made of material transparent to UV light such as glass, is aligned on top of the epoxy 50. The perforations 56 extend orthogonal to, and through, the plane of grid 52.

Figure 3B:
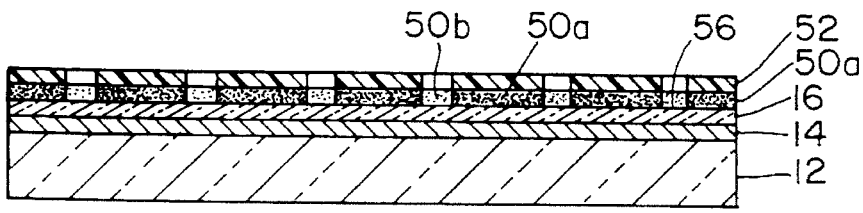
FIGS. 3b and 3c show cross-sections of the structure of 3a after additional steps in the process.
Figure 3C:
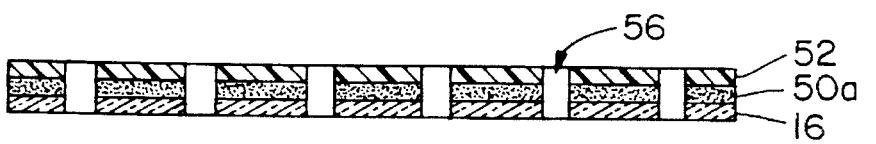

A photomask 58 with opaque areas designed to cover the perforations 56 is then positioned over the grid 52 (FIG. 3a). (An optional UV transparent mask release layer can be placed between the mask 58 and the grid 52 if intimate contact is desired to facilitate mask removal). UV light is focused onto the mask, curing the underlying epoxy 50a everywhere except beneath the opaque areas 58, as shown in FIG. 3b. Wherein the cured sections of epoxy 50 are shown in shaded section and the uncured sections are in blank. The mask 58 is removed. The uncured epoxy 50 is removed from the openings 56 by a suitable solvent and the LED structure 16 etched away through the openings down to the release layer 14. The release layer is then etched away using openings 56, as provided above. Access for the etchant is thus achieved at many points across the wafer, resulting in a large area LED structure attached to grid 52 by cured epoxy 50a (FIG. 3c).

Figure 4A:
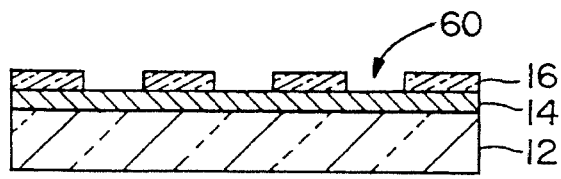
FIGS. 4a–4e are schematic drawings of a wafer during various steps in the processing flow involved in a further lift-off embodiment of the invention.
Figure 4B:
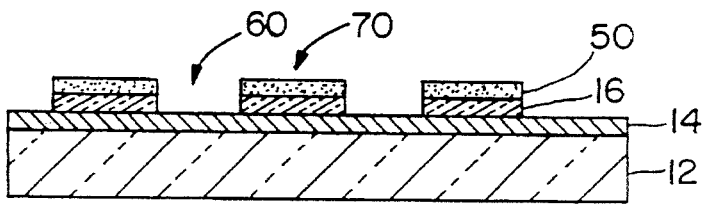
Figure 4C:
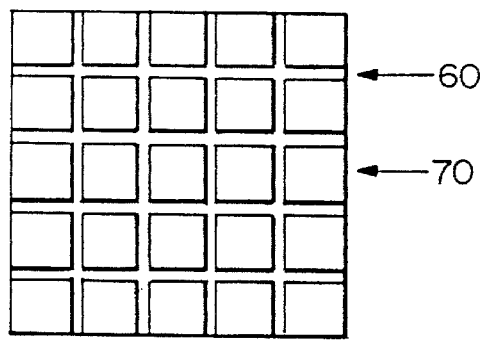

Another approach to registration is to form channels 60 directly in the LED material by etching down to the release layer 14, thereby forming channels in the LED material alone (FIG. 4a). Any other method that forms channels 60 or access streets between the areas 70 to be separated, as shown in the plan view of FIG. 4c, could also be used including the previous UV cured epoxy technique.

Figure 4D:
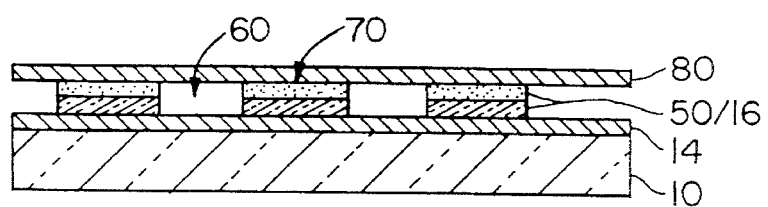
Figure 4E:
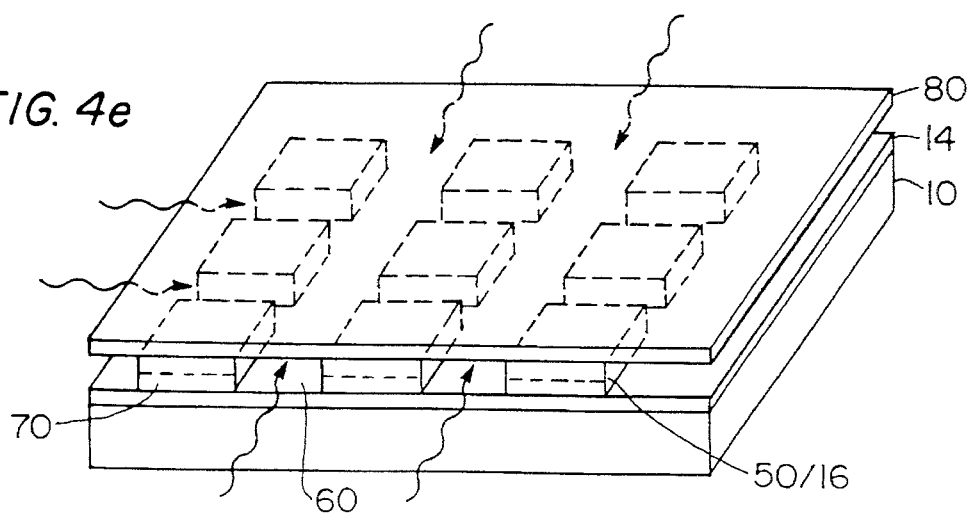

A support 80 can then be attached to the material 70 over the channels 60 and then the etchant can be allowed to run along the channels, thereby giving the etchant access to the center of the wafers (FIG. 4d/4e). The support materials must be rigid enought that they do no fill in the channels that have been formed and thereby force the etchant out. As shown in FIGS. 7a–7c, rigid alumina support 110, combined with double-sided UV release tape 120, may be used. One side of the tape 120 is adhered to the alumina, and the other side of the tape is adhered to the front of the structure 16 after the channels have been formed.

These UV release tapes are well known in the industry for dicing and shipping small devices and have proven to be an excellent support/adhesive choice in the present application for several reasons. These tapes have the property that when they are exposed to intense UV radiation, they lose most of their adhesion, so they can be easily removed. In addition, moisture does not seem to effect the adhesive, and they can be applied with great success, even if submerged in liquid.

The second, rigid support 110 should be formed from material which is transparent to UV radiation if it will be desired to release the devices later. It should also not be attacked by the specific etchant used. After the support 110, 120 is applied, the etchant is then allowed access to the sample and will run up the channels and undercut the devices. The devices are then released attached by UV releasable tape 120 to the alumina 110. Taller channels may assist in speeding up the capillary action to achieve faster release times. Other methods may also be employed to speed along the movement of the etchant up the channels 60, including vacuum assistance, ultrasonic assistance, etc.

Figure 6A:
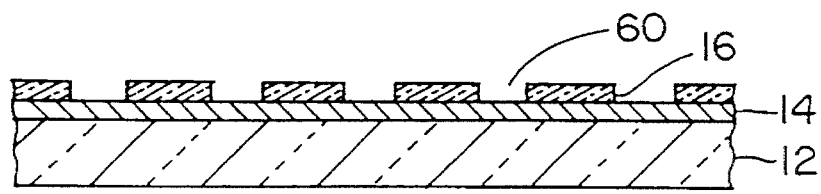
FIGS. 6a–6d are schematic drawings of a wafer in yet another LED lift-off process in accordance with the invention.
Figure 6B:
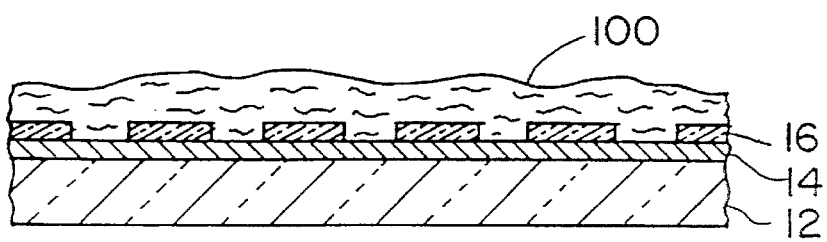
Figure 6C:
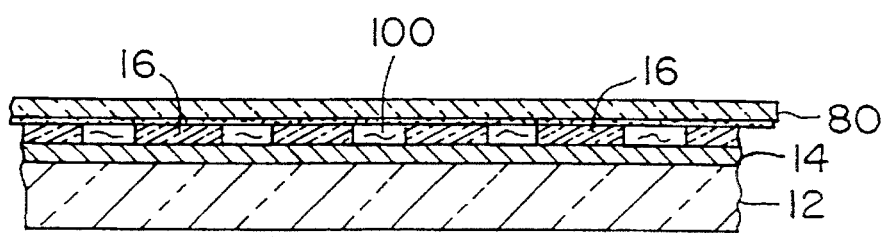
Figure 6D:
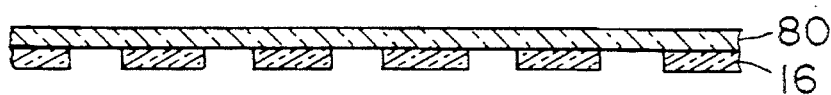

Another way to speed up the action of the etchant is to avoid the problem altogether by placing the etchant on the surface of the layer to be lifted after the channels are made (FIG. 6a) but prior to the affixing of the support (FIG. 6c). This can be done by pouring the liquid onto the surface (FIG. 6b), or submerging the sample during application of the support material 80.

The tape's adhesion can then be released by UV irradiation through the alumina (FIG. 7b) and the tape can be taken off the alumina carrier with the devices still attached. Further UV exposure will decrease the adhesion of the devices to the tape, allowing them to be removed by vacuum wand or to be transferred directly from the tape to any other tape, epoxy, or adhesive medium (See FIGS. 7b or 7c). FIG. 7b shows release directly to another tape 110a whereas FIG. 7c illustrates release by affixing with epoxy 15 to a rigid substrate 25. Discrete areas as large as 0.5 cm in width have been lifted, released and transferred by this non-curvature method. The total wafer area which can be lifted simultaneously in a registered fashion by way of this channel method appears to be limited only by the wafer size.

Figure 5A:
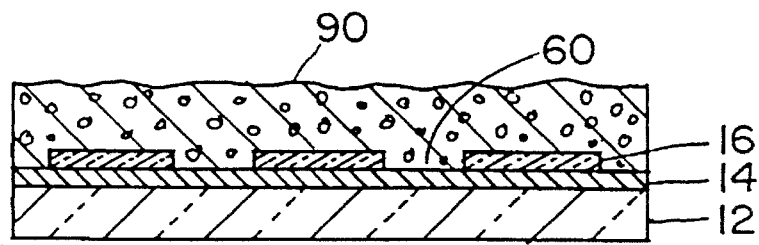
FIGS. 5a–5b are schematic cross-section drawings of a wafer subjected to another lift-off procedure in accordance with the invention.
Figure 5B:
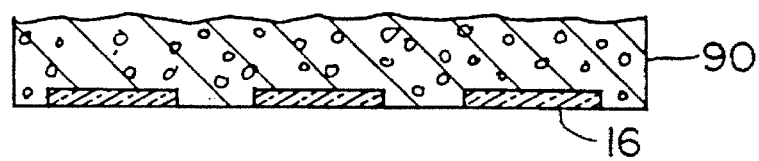

Along the same lines, channels 60, as shown in FIG. 5a can be made in the LED material 16 to expose the release layer 14 below. A porous material 90 is then spun on, or otherwise formed or attached to the front surface (FIG. 5a). This material is rigid or semi-rigid when cured by light, heat, or solvent release, and therefore will be able to support the lifted film (FIG. 5b) after separation from the substrate 12.

The material is sufficiently porous to pass the etchant fluid without being altered by the etchant. In this way, the etchant passes through the porous material and is given access to the release layer at its exposed points.

The channel method and porous material method for liftoff allow for a solid support medium to be employed without requiring performations for etchant access. The liftoff time is very short because the etchant has access to the release layer from many points on the wafer surface. Also, this method results in devices which are registered with respect to each other and are supported by the alumina or other rigid material for backside processing.

II. LEDs and LED Bars

Formation of LED's or LED Bars having a unique thin film structure and other features which provide a highly efficient light emitting structure will now be described in connection with FIG. 1 in which an LED semiconductor-layer structure 16 is formed on release layer 14, preferably by OMCVD. Note that while FIG. 1 has previously been used to describe lift-off procedures, the lift-off method is considered to be optional, but preferred in this discussion. Structure 16 is formed of materials having appropriate bandgap for the desired emission wavelength, such as III–V materials. Structure 16 is preferably comprised of an n-doped upper cladding layer 16a, an active p-doped layer 16b and a lower p-doped cladding layer 16c (See FIG. 1e). Preferably, the cladding layers 16a and c are formed of III–IV materials, such as $Al_xGa_yAs$, (y=x−1) and the active layer 16b of $Al_zGa_{1-z}As$. A contact layer 16d, preferably of GaAs, is also formed on the top (light emitting surface), of upper cladding layer 16a and an optional bottom contact layer 16e is provided beneath layer 16c.

Note: As a matter of convention, the light emitting side of the LED will generally be referred to as the "front side" herein. Also, the conductivity of the layers may be reversed, such that, the upper layers 16d and a are p-type and the lower layers 16b and c are n-type.

By using OMCVD and by using the above-mentioned isolation systems, the LED structure 16 can be made very thin, i.e., less than about 5 microns and, preferably, less than 3 microns, with the contact layer 16d being less than 0.1 micron thick, the cladding layers 16a and c about 2 microns thick and the active layer 16b less than about 1 micron.

Figures 1D, 1E, 1F:
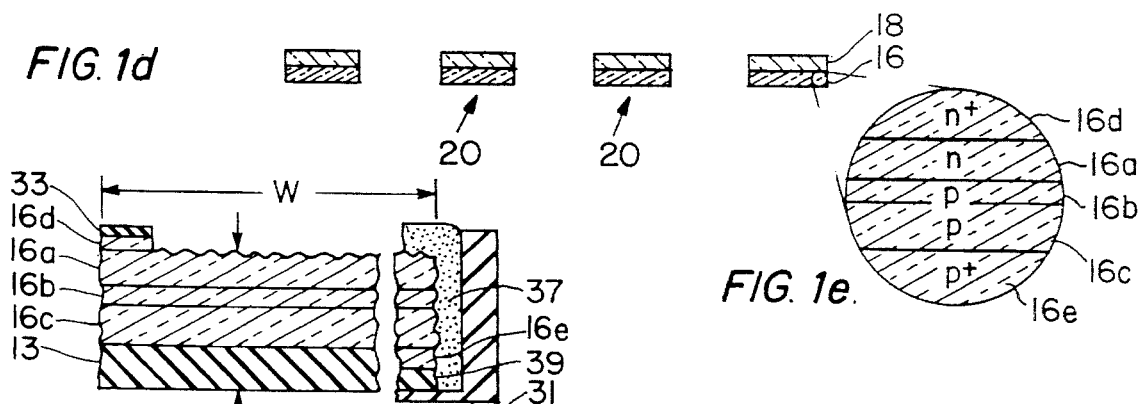
FIG. 1e is an enlarged view of a portion of the LED layer 16 of FIGS. 1a–1d.
FIG. 1f is a cross-sectional view of a single LED formed according to the process of FIGS. 1a–e.
Figure 2A:
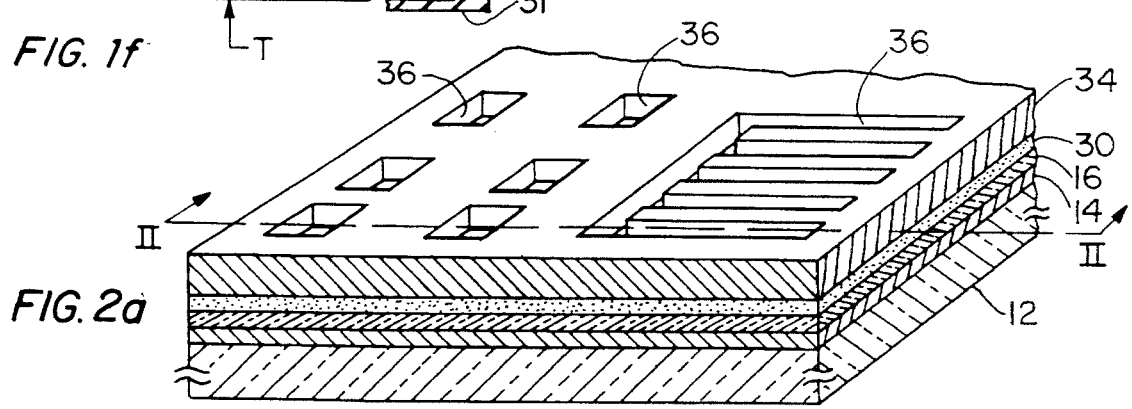
FIG. 2a is a partial perspective view of a portion of a LED wafer during lift-off processing, according to a second embodiment of the lift-off process.
Figure 2B:
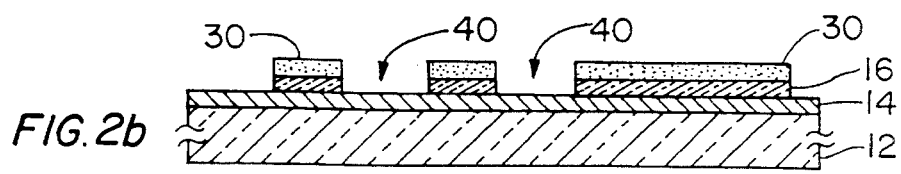
FIG. 2b is a sectional view taken along lines II—II of FIG. 2a of the lift-off structure after one step in the process.

A section of an LED pixel formed as above is shown in FIG. 1f with the contact structure added. For more efficient operation, the cladding layer 16a on the light side of the pixel is roughened; as shown in FIG. 1f to increase the probability of multiple bounces of light rays within the LED and thereby increase the probability of achieving a good exit angle. Note: The roughened surface can be on the bottom side instead of the front side. Also the LED structure 16a, b, c is a thin transparent double heterostructure and the substrate is removed and replaced by a light reflector layer 13 of material such as Al or a white diffused surface such as MgO on white ceramic, for improve quantum efficiency. Finally, unlike the conventional cubic geometry of discrete LEDs, the LED of FIG. 1(f) has a rectangular geometry with a high ratio of width to thickness. For example, the width W preferably ranges from about 50 microns to about 150 microns while the thickness T is about 5 microns or less for a 10 or 20 to 1 ratio of W/T. The pixel length L is generally about 200 to 400 microns.

Contacts 33 and 31 are formed on the front contact layer 16d and the back contact layer 16e respectively. Preferably the back layer contact is extended up to the front surface to form a planar structure. A passivating, isolating spacer 37 of $Si_3N_4$ or $SiO_2$ is formed between the LED structure and contact 31. Contact surface 39 may be formed of $n^+$ GaAs if contact layer 16e is an n-type layer. Optionally layers 16a, b and c may be stepped at the edges and a conformal coating of $Si_3N_4$ or $SiO_2$ deposited over the edges.

Although the above description was made using AlGaAs and GaAs layers, the invention can be applied to other III–V lattice-matched material system; for example, the active layer 16b can be replaced with $Ga_xIn_yP$, which is lattice match with GaAs and GaAlAs, and which has better light emitting properties. For lattice-matching x should be roughly equal to y. The cladding layers may also be replaced with $Al_xGa_zIn_yP$. For lattice matching to GaAs, x+z−y. Finally, the active layer GaInP can be replaced with $Al_xGa_zIn_yP$ as long as it can be lattice-matched to GaAs. Such LEDs, with AlGaInP compounds, can range in emission wavelengths from about 0.55 μm to 0.70 μm.

Note that the active layer 16b is doped with a p-type dopant, preferably carbon, during the OMCVD process. Zinc, the conventional impurity used for p-type doping in LEDs, is typically introduced by diffusion after the growth process and is highly diffusive over the life of the LED. Consequently, the pixel or dot location may vary due to such diffusion. Carbon is very non-diffusive, leading to greater uniformity in dot location and longer device life. Therefore, carbon-doping in the active layer of LEDs is much preferred.

The Al content "x" may be varied for different devices, but the cladding layers of AlGaAs should be as heavily doped as reasonable. The Ga content "y" should be less than "x". Also, the Al content, z, of the active layer should be less than x. Usually both cladding layers have the same Al content, but that is not necessary.

The above-mentioned structures are excellent for LED discrete devices as well as LED bars. Referring now to FIGS. 8–12, further embodiments of the invention will be described in connection therewith. FIGS. 8, 10 and 11 summarize the important steps of three alternate processes for fabricating LED bars in accordance with the invention. Beneath each step is the corresponding wafer structure shown in side view.

Figure 12A:
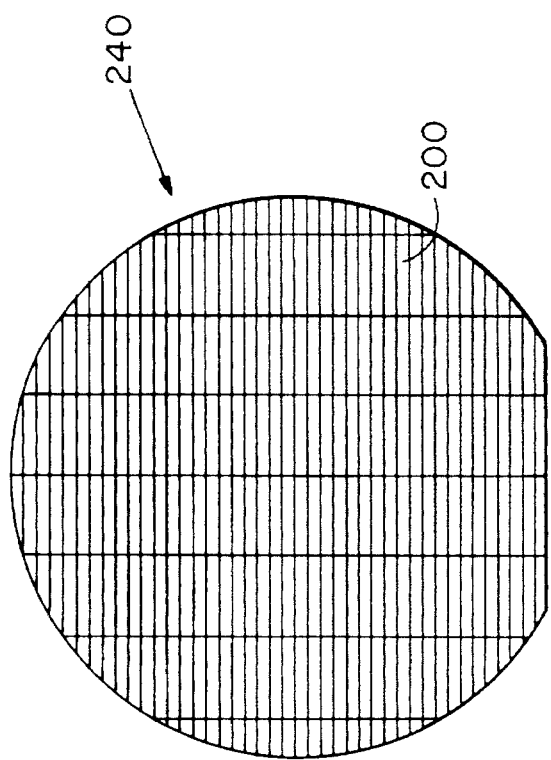
FIG. 12a is a plan view of a wafer before being diced into separate LED bars.
Figure 12B:
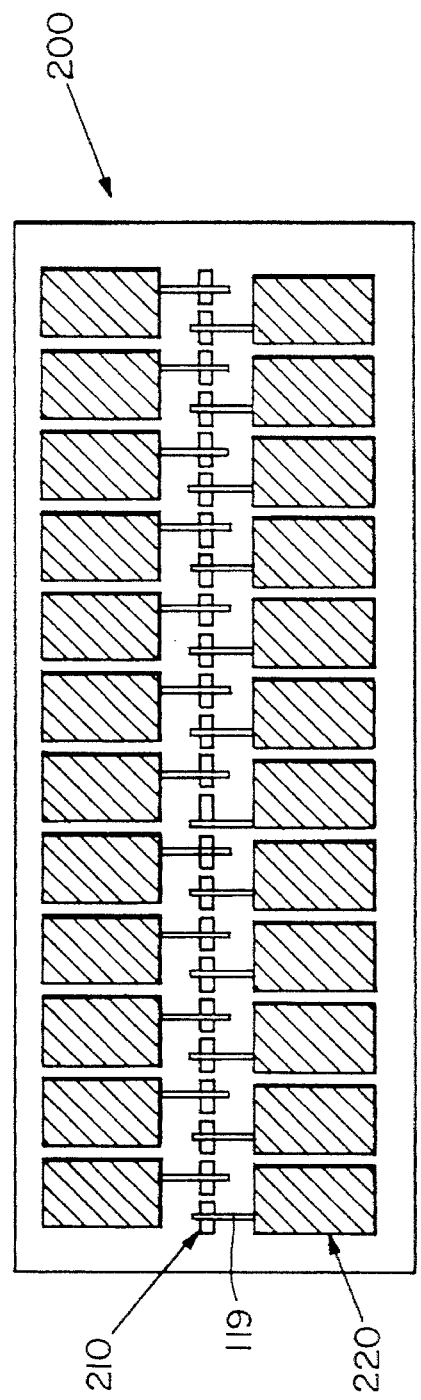
FIG. 12b is a plan view of an LED bar 200 made in accordance with any of the processes described in connection with FIGS. 8, 10 or 11.

Each LED bar 200, when processed, as shown in the plan view of FIG. 12b, consists of a die 200 measuring about 0.5 mm by 20 mm cut from a wafer 240, as shown in FIG. 12a, upon which several hundred such dies are fabricated in accordance with FIGS. 8, 10 or 11. Each die or bar 200 is comprised of a row of many microscopic, laterally isolated, LEDs 210, each LED forming a pixel of light or a "dot". Each LED 210 in a row is addressable from its own bond pad 220 connected by conductor 119 to a pixel contact area.

Note that while the invention is explained herein in connection with LED Bars it is contemplated that the individual LEDs 210 may be diced and separated along with each respective bond pad, coupled by conductor 119, to form discrete LEDs of unique configuration, in that, the bond pad is formed beside the LED and is therefore highly accessable and does not need to be wire bonded to the LED pixel.

The main steps in LED bar fabrication are:

a) epitaxial growth to form the required LED epitaxial layers 16 and p-n junctions therein, as described in connection with FIGS. 1–7;

b) dot definition to delineate the edge of the LED spot;

c) front side metallization for contacts;

d) optional lift-off procedure as previously described in connection with FIGS. 1–7; and e) backside metallization.

Only steps b, c and e will be described in detail herein, it being assumed that any of the lift-off methods and growth methods previously described can be used in connection with the steps described herein to form registered or unregistered LEDs or LED bars.

Referring now to FIG. 8, a mesa isolation method of dot definition is shown therein. Note: for each process step block, the corresponding structure is illustrated in section below. Step a) comprises pre-epitaxial cleaning of wafer 12 using well known techniques, such as soaking in $H_2SO_4/H_2O_2$ and $H_2O$, followed by OMCVD deposition of AlGaAs/GaAs epi-layers 16, in which a p-n junction is formed in the active GaAs layer (Step b).

Next, using well known photolithography techniques, individual dot junction areas 40 are defined over the surface of epi-layers 16 beneath areas of photoresist 105 (Step c). Next, the exposed epi-layers 16 are etched away down to just below the p/n junction or alternatively all the way down to substrate 12 (Step d). The resist 105 is removed and a protective coating 106 of $Si_3N_4$ or oxy-nitride (SiON) is formed over the top surface (Step e). Contact areas 171 are photolithographically defined by resist 115 over the nitride 106 (Step f). The nitride 106 is etched away beneath the resist openings (Step g). The resist is stripped away and a "lift-off" photo-resist layer 117 is formed over the top surface, except where the metal contacts will reside (Step h). Front metallization layer 119 is evaporated onto the resist contacting the exposed epi-layer surface aligned in the LED dot (Step i).

The resist 117 with metallization 119 is then removed using well-known photoresist stripper liquids, leaving metal contacts 119' remaining and applied to each dot 16 (Step j). These contacts extend over the nitride 116 to the edge of the chip (See FIGS. 9 and 12) where individual bond pads are formed to address each dot 16'. Contact metallization 121 is then applied to the back of the substrate 12.

FIG. 10 illustrates an alternate dot definition method utilizing ion beam implantation. Steps a and b are as set forth in connection with FIG. 8. In step c, an implant mask of photoresist 105 is formed which defines regions 41 between LEDs which will be ion bombarded to implant protons 111 (Step d) to laterally isolate individual dots or pixels 16', separated by highly resistive bombarded regions 41' (See FIG. 10 notes). Next (Step e), a lift-off photoresist layer 115 is formed on the exposed top surface of epi-layers 16 with openings left where contact metallization 119 will be evaporated (Step f). The metallization is removed everywhere, except where desired, to form individual contacts 119' for each dot 16'. Contact metallization 121 is then applied to the backside (Step h).

FIG. 11 depicts an alternate dot definition process that does not require a separate deposit of a dielectric layer with associated photolithography, as in FIG. 8. Steps a–b are as above. In this alternate method, after defining the dot edges (Step c), the cap or contact layer 16d [discussed in connection with FIG. 1(e)] is etched away (Step d). The exposed epilayer surface 16 is then anodized to form an insulating oxide 108, thus creating a dielectric in the proper pattern. This method, as in the method of FIG. 8, limits current spreading to the pixel area where it is desirable for uniform current injection. But, by removing the cap layer from regions between dots, illumination within the confines of each dot is maintained. Current spreading is further eliminated by growing an extremely thin upper cladding layer 16a, which will have very high lateral resistivity. Conventional cladding layers are 20 microns or higher. OMCVD enables fabrication of 0.5 micron, or less, layers with 0.2 micron being a preferred thickness for layer 16a.

The resist 105 is then removed (Step f) and a photoresist layer 115 formed, except where contacts are desired. Metal layer 119 is evaporated over and between the resist (Step h) and removed (Step i) leaving contacts 119' to each dot 16'. The structure is then ready for back metallization 121, as previously described in connection with FIG. 8 (Step j).

In a variation of FIG. 11, the cap 16d and cladding layer 16a could both be anodized, eliminating the need for a cap etch step.

The above processes offer many advantages over other known systems of fabricating LEDs or LED bars. Some of these are the following:

Lattice-Matched System. The epitaxy process is very nearly perfectly lattice matched, since it is made in the GaAs/AlGaAs system rather than the GaAs/GaAsP system. Thus, compositional grading to achieve lattice matching is not required. The epi-layers are thin (less than 3 microns) as opposed to 20 to 30 microns in the GaAs/GaAsP system. Since the layers are thinner and are made by OMCVD, the layers yield much more uniform electroluminescence, making the LED bar more uniform. Since the epitaxial layers are lattice matched, it is also a simple matter to change the process to grow LEDs of any wavelength in the range of about 650 nm to 870 nm. The above processes can also utilize GaInP for the active epi layers and AlGaInP for the cladding layers. Another possible lattice matched system is GaInAsP/InP.

Better Confinement of Injected Carriers. The beneficial properties of AlGaAs layers can be used to enhance the optical output of the LED devices, in a manner similar to heterojunction lasers. The AlGaAs is used to reflect carriers so that they are confined to the volume in which the optical radiation is to be generated. This enables the generation of much higher efficiency and optical output than is believed to be possible in the GaAs/GaAsP system.

Epitaxially-grown P/N Junction. The junctions are grown during the OMCVD process. In general, in GaAs/GaAsP technology, the junction is diffused. The epitaxial junctions are of extremely high quality and can be placed anywhere in the structure. Diffused-zinc junctions used in GaAs/GaAsP have the following limitations: the zinc causes p-type doping, so the structure must be p-on-n (whereas epitaxial junctions can be p-on-n or n-on-p); the zinc concentration must be highest at the surface and must have a diffusion profile (whereas epitaxial doping can have any profile), the diffused junctions are limited to zinc (whereas epitaxial structures can be zinc, or carbon, or other dopant as desired).

Implant Isolation. In the FIG. 10 embodiment, the epitaxial wafers are implanted with protons to destroy the crystal quality of the regions between the dots. This isolation is used to prevent the current from spreading beyond the desired dot perimeter. (The GaAs/GaAsP technology uses patterned diffusion.) An additional advantage of implant isolation is that the surface becomes nonconducting so that the metallization can be placed directly on the semiconductor, without dielectric insulators, and no short circuit will occur.

Use of GaAs Cap. A very thin layer 16d, about 1000 Å thick, of GaAs is provided on the top surface for three reasons: ease of contact, environmental stability, and improvement in current spreading. The GaAs is kept thin to allow most of the generated light to escape. If the cap is much thicker than 1000 Å, it will absorb a significant amount of light. Environmental stability is a factor because AlGaAs can oxidize in air if left uncoated. The GaAs cap 16d provides the required coating.

LED Bars fabricated as described above may be modified as shown in FIGS. 23–26 to incorporate a cantelevered contact bar 240 which mates with a corresponding contact bar 242 on a processed silicon wafer 260. In this way, a hybrid Si/LED structure can be formed with a minimum of wire bonding and avoidance of alignment problems.

Contact Bar 240 is bonded or otherwise affixed to the front side of LED bar 270 and contact wires 219 extended to each pixel 261. Back contacts 280 are formed on the back of LED Bar 270.

A eutectic alloy 290, of, for example $Au_{0.8}Sn_{0.2}$ is formed on the side walls of the wafer 260 and/or the back of LED Bar 270. The bar 270 and wafer are joined so that the contact bars 240 and 242 overlap. The joined structure is heated to the melting point of the eutectic (i.e. about 252° C.) and allowed to cool to room temperature thereby bonding the contact bars and structure together. The contact bars may then be laser trimmed or etched or scribed to form bonding pads 250,252 (shown in dotted lines) for interconnecting Si circuits 292 to specific pixels. Si circuits 292 may comprise Si transistors connected to form driver circuits for energizing the individual LED pixels 261.

III LED X-Y Arrays

Figure 14A:
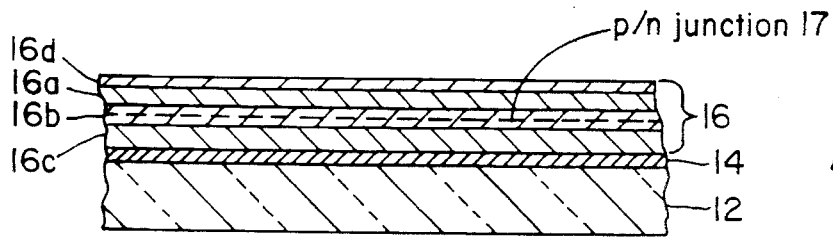
FIGS. 14a–b are schematic sectional views of a wafer being processed to form an X-Y addressable LED array.
Figure 14B:
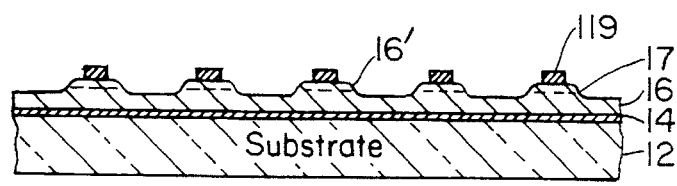

Next, the fabrication of an X-Y multiplexed array, in accordance with the invention, will be described. It begins with the epitaxial growth of the required hetero-epi-layers of AlGaAs and GaAs layers on a GaAs or Ge substrate. In the case of the GaAs substrate 12, an optional layer 14 of AlAs is formed between the active AlGaAs layers 16 and the substrate 12 to facilitate substrate removal by the etch-off method. The AlAs forms an etch stop layer. [Alternatively, the X-Y array can be removed from the substrate by a CLEFT process (See U.S. Pat. No. 4,727,047 issued Feb. 23, 1988 to Fan et al.) or chemical epitaxial lift-off]. In the case of Ge substrates, a layer of AlAs can be used as an etch stop, but AlAs is not really necessary, since the Ge substrate can be dissolved in $H_2O_2$ without harm to the AlGaAs active layers. FIG. 14a shows the epitaxial layer structure to comprise a bottom cladding layer 16c of AlGaAs, an active GaAs (or AlGaAs) layer 16b in which a p-n junction 17 is formed by carbon doping during growth, a top cladding layer 16a of AlGaAs and thin GaAs contact layer 16d, all, as previously described, formed by OMCVD. A pattern of contact pads 119 and busbars (not shown) is formed by photolithographic techniques, evaporation, and/or electroplating on the front surface, as shown in FIG. 14b. Next, the p/n junctions 17 are isolated by etching part way into the epi-layers 16, as shown in FIG. 14b. This step is not absolutely required at this point, however, it simplifies a later etch step in the process.

Figure 14C:
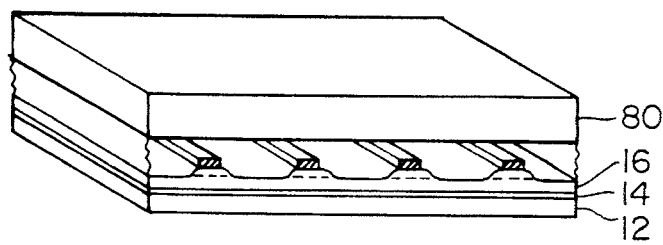
FIGS. 14c–e are schematic partial perspectives showing a wafer during successive additional process steps.
Figure 14D:
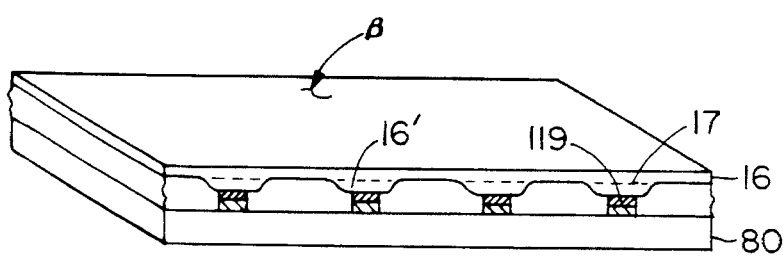

The next stage of the process consists of bonding of the wafer to a support 80, such as glass, ceramic, or thin stainless steel. (If the support is transparent to infrared radiation, downstream front-to-back alignments are facilitated, but the alignments can also be carried out by careful registration to the support edges.) The processed front side is bonded to the support 80 using a suitable adhesive (not shown) (FIG. 14c). After the support 80 is attached, the wafer or substrate 12 is etched off (or cleaved off) leaving the LED film 16 attached to the support 80, as shown in FIG. 14d, in which the structure has been flipped over onto the support to expose the backside B for processing.

Once the backside is exposed, any remaining non-essential material is removed from the back by selective etching in HF to expose a clean GaAs contact layer B. The backside (X-axis) contacts 121 and busbars 121x are now photolithographically patterned and electroplated or evaporated onto the contact regions 16'.

Figure 14E:
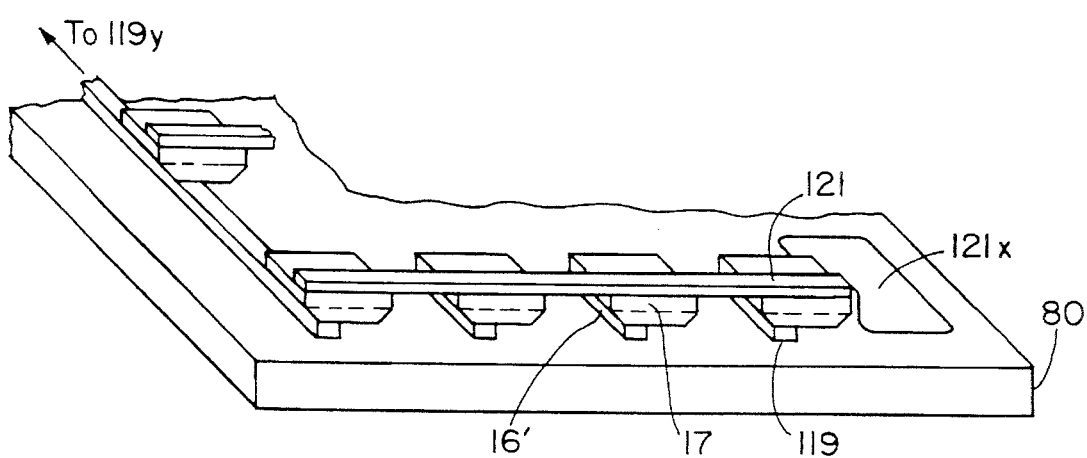
Figure 23:
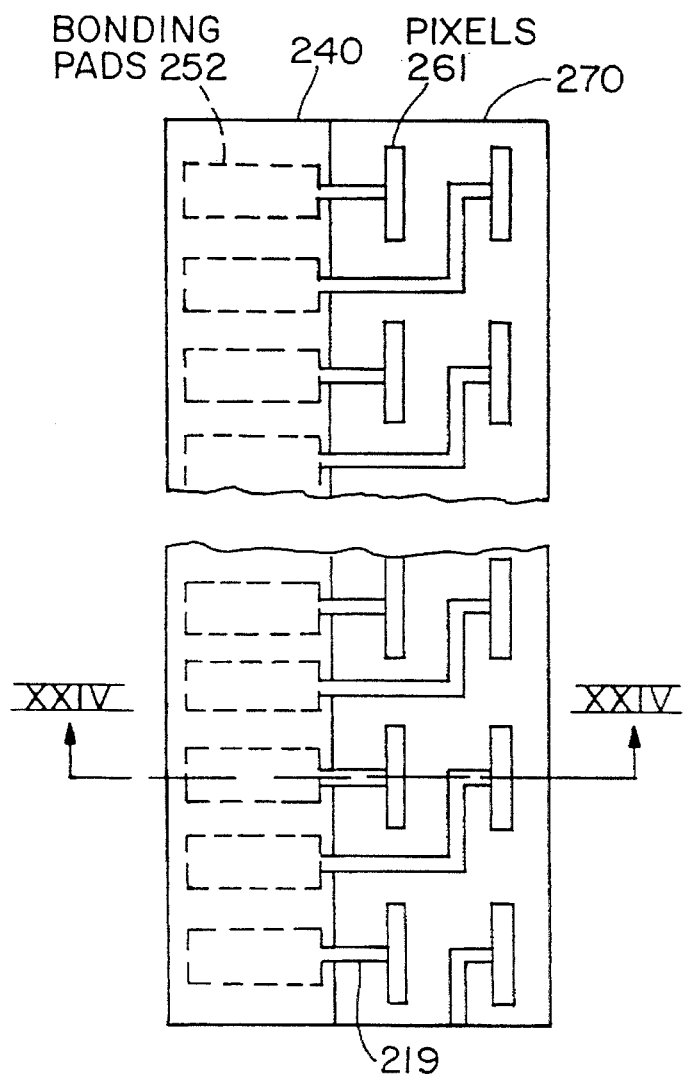
FIG. 23 is a plan view of the top of an LED bar in accordance with the invention.
Figure 24:
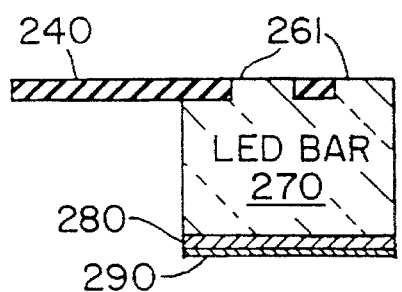
FIG. 24 is a schematic side view of FIG. 23 taken along lines XXII—XXII.
Figure 25:
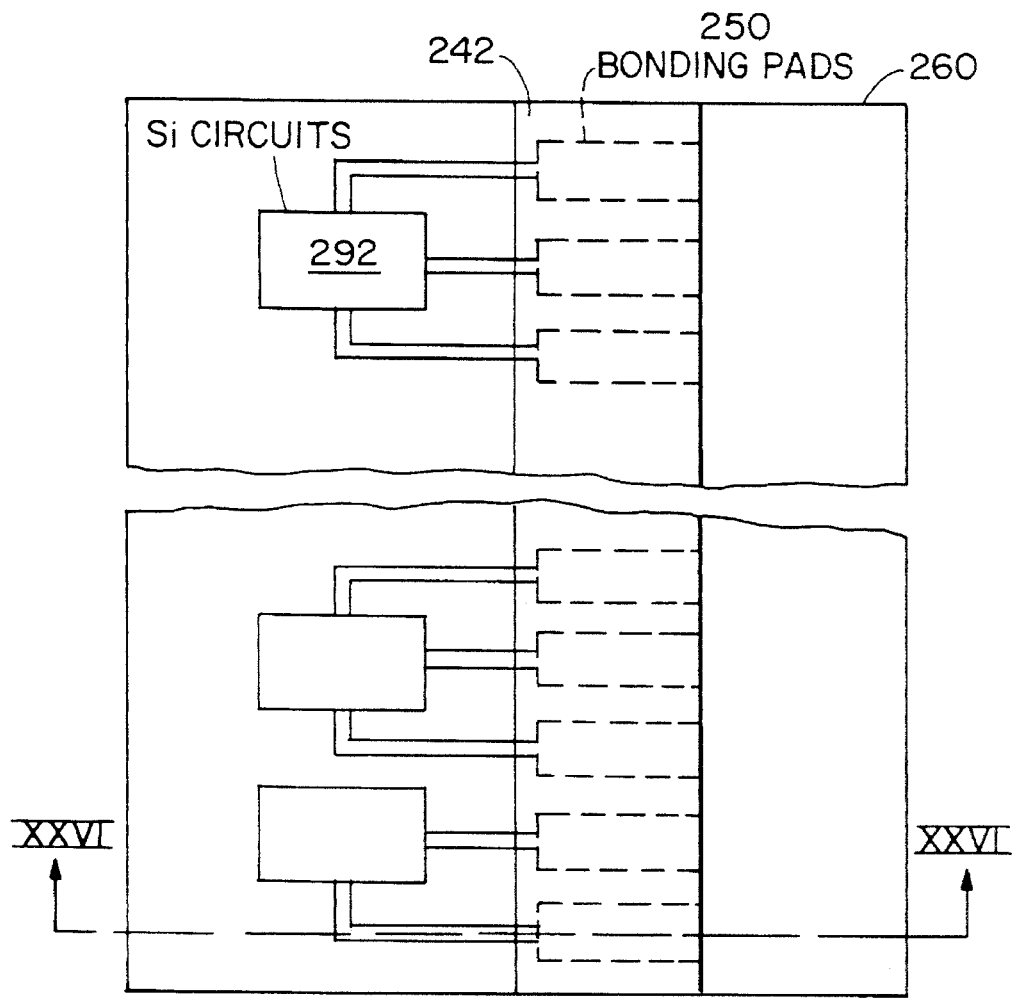
FIG. 25 is a plan view of a silicon wafer adapted to mate with the LED of FIGS. 23 & 24.
Figure 26:
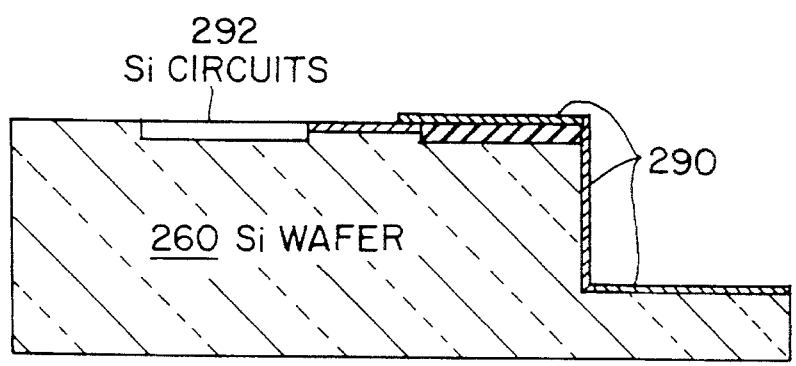
FIG. 26 is a schematic side view of a silicon structure taken along lines XXV—XXV of FIG. 25 adapted to mate with the LED bar of FIGS. 26 & 24 to form a hybrid circuit.

Finally, the backside is exposed to the mesa etch to totally separate the dots. At this point, all of the epi-material between the pixels 16' is removed (FIG. 14e). Alternately, the isolation may be completed by implant isolation, or by limiting the current spreading, as described for LED bars in connection with FIGS. 8, 10 and 11. By not removing all of the interpixel material, a path for lateral heat flow out of the pixel is preserved.

As shown in FIG. 15, the front and backside processed X-Y array 300 may be mounted directly to silicon wafer 323 in a precise location 310 with X and Y silicon driver circuits 320 and 322 formed in wafer 323 and coupled to the X and Y bonding pads 324 and 326, respectively. Bonding of array 300 to wafer 323 may also be accomplished as described previously in connection with FIGS. 23–26 by having the contact pads 326 replaced by cantelevered bars which extend over to pads on wafer 323 which can be trimmed to form circuit bonding pads.

Suitable silicon logic circuits 330 and interface circuits 332 are formed on wafer 323 to control which pixel 16 is illuminated in the X–Y matrix. Note that the driver circuits activate individual pixels by applying a positive voltage to a pixel in a top column, for example, pixel 1601 via bus bar 326a, while a negative voltage is applied to the same pixel 1601 via Y-driver 322 to bottom bus bar 324a, thus completing the current circuit through the LED 1601.

It should be noted that the substrate removal methods for fabrication of LED arrays include CLEFT, lift-off, and substrate etch-off. CLEFT and lift-off are appropriate if the substrate is to be reclaimed as a solid wafer. The etch-off process simply comprises the chemical dissolution of the substrate. Note that the substrate material may still be reclaimed in the etch-off process; however, it must be precipitated from the etch solution. The substrate can also be lapped off, as is conventionally done in the industry.

Also note that in the first step of the backside process, undesired epitaxial layers are removed; these layers are present to initiate the epitaxy, or may be buffer layers that are not needed in the final device. To make their removal simple, an AlAs etch stop layer (not shown) may be provided in the epitaxy between these layers and the epitaxial device structure. The layers can then be removed in etches that stop at AlAs, such as the well known PA etches. At a pH of about 8, these etches dissolve GaAs 1000 times faster than AlGaAs. After the etch stops at the AlAs, the AlAs can be removed in HF or HCl.

In the process described above, the backside of the substrate is provided with multiplex-compatible metallization to contact the back of each pixel. Note that this type of processing requires front-to-back alignment. The pixels are then separated by a mesa etch. Since the films are only about 5 microns thick, the mesa etch is straightforward and quick.

The etching may be accomplished with either wet or dry processing. At this point, the exposed semiconductor may be coated with a dielectric to prevent oxidation.

Finally, the wafers are formed into individual dice. The dice 300 (See FIG. 15) are mounted in a pin grid array (PGA) or leadless chip carrier socket (neither shown). If the pixel count is sufficiently high (>1000), the X-Y drivers 320, 322 and logic multiplexing circuits 330 should be mounted within the chip carrier. The reason for this is that the wire count becomes excessive for high pixel numbers. The wire count is approximately the square root of the pixel count. Preferably, the array is mounted on the Si circuitry itself, and interconnected using thin film techniques and photolithographic processing. The circuit and array are then mounted in the leadless chip carrier or PGA.

Figure 13:
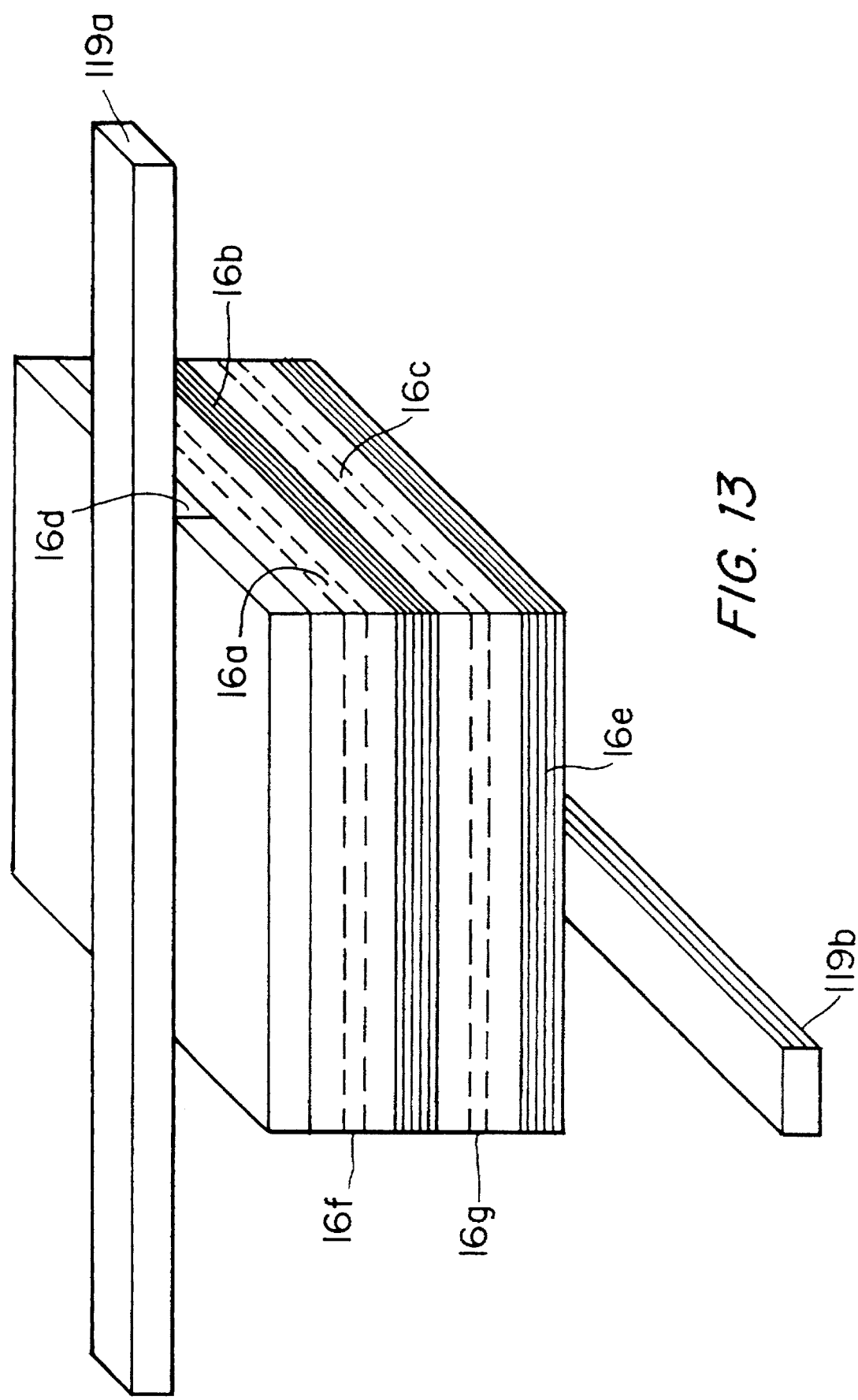
FIG. 13 is a perspective view of a LED pixel from an X-Y addressable LED array embodiment of the invention.

As shown in FIG. 13, reflection from the back surface may be used to enhance emission. FIG. 13 is a perspective view of an LED array pixel showing the upper and lower cladding layers 16a and 16c with the active layer 16b between them. Thin contact layers 16d and 16e are formed on the front and back sides, respectively, and conductors 119a and b run orthogonal to each other on the contact layers. The back surface contact layer 16e of GaAs extends across the total pixel surface and serves as a back surface reflector. The back surface reflector reverses the light propagating toward the back of the pixel, so that it is directed toward the front surface. The back surface 16e may also serve to scatter light into the escape cone; which is a range of angles that rays, propagating within the LED crystal, must fall within for the ray to propagate beyond the semiconductor/air interface.

Tuning of individual epi-layers may also be provided to further improve LED efficiency. For example, assume a structure, such as the LED shown in FIG. 13, in which the epi-layers have the following properties:

| Layer | Refractive Index | Wavelength $\lambda/n$(Å) | Composition AlGaAs |
|---|---|---|---|
| AIR | 1 | 6500 | N/A |
| 16d | 3.85 | 1688 | 0 |
| 16a | 3.24 | 2006 | 80% |
| 16b | 3.60 | 1806 | 38% |
| 16c | 3.24 | 2006 | 80% |
| 16e | N/A | N/A | Metal |

The active layer 16b, could be made "resonant" by making the active layer thickness a multiple of half the wavelength (i.e., a multiple of 903 Å). For example, an active layer thickness of 4510 Å or 5418 Å would be preferable to 5000 Å. Such a resonant structure could yield superluminescence or stimulated emission which would enhance the optical output. A benefit of stimulated emission in the resonant structure would be that all of the light thus generated would be in the escape cone.

The front (top) cladding layer 16a is set for maximum transmission (quarterwave or odd multiple). The quarterwave thickness is 503 Å, therefore the top layer should be 0.55 microns, or if better current spreading is needed, 1.05 microns.

The back cladding layer can be tuned for maximum reflection by using even multiples of 503 Å, such as 10×503 or 5030 Å.

Optional front and back Bragg reflector layers 16f and 16g, respectively, may be incorporated into the device of FIG. 13 during OMCVD growth, thereby converting the LED into a vertical cavity laser. The laser cavity is bounded by the Bragg reflectors 16f and 16g and the emitted light will be phase coherent. The Bragg reflectors are formed by alternating many $Al_xGaAs/Al_zGaAs$ layers. A sufficient number of layers will yield a high reflection coefficient. The electrical cavity is formed by the AlGaAs cladding layers. Thus, vertical cavity lasers can be in an X-Y array, or may be formed in a laser bar. The feature that makes this possible is the double-sided processing approach, which permits a wide range of pixel structures, including LEDs, lasers and detectors.

A light detector array 450 can be formed in a similar manner. To form a light detector array, the epitaxial films are doped so as to form a p-i-n structure, rather than an LED. The active layer comprises a semiconductor chosen for absorption over the wavelength range of interest. For example, long wavelength detection could utilize InAs grown on an InAs substrate. Alternatively, InGaAs grown on InP or GaAs could be utilized for mid-IR detection. Near IR is detected with GaAs or AlGaAs. The fabrication of the detector must include edge passivation to maintain minimal dark current, but is otherwise the same as the LED array processing previously described.

The multiplexing electronic detector circuitry is somewhat different than the LED driver circuit, since it must sense the current generated in each pixel in sequence, rather than supply current. The electronics is nevertheless straighforward, and is similar to charge coupled device (CCD) circuitry. In fact, the device could be formed using a CCD array instead of a p-i-n array.

An infrared-to-visible digital image converter can be formed from a detector 450 and light emitting diode array 300 (as shown in FIG. 19). The converter is useful for night vision devices, as well as for digital processing of IR and visible video data.

Current image converters utilize a photocathode-based system that converts IR radiation to visible. The conversion process is a direct analog process. Owing to this design, the direct analog process is not particularly amenable to digital image enhancement. There are also various displays that could be superimposed over the night vision display to provide the user with communication or computer data. However, the photocathode display is not easily adaptable to display applications.

A digital pixel-based system, in accordance with FIGS. 18 and 19, functions both as an IR image converter, an image enhancing device, and a display.

The converter invention consists of three main elements: the IR detector array 450, the multiplexing electronics 470, and the light emitting diode (LED) array 300. A diagram of the IR image converter is shown in FIG. 19. An IR image is focused by lens 460 on a multiplexed X-Y array 450 of IR detectors. The pixel data from the detectors is processed by the electronics 470, which then drives a synchronous multiplexed LED array 300. Note that the processor can accept external data via data port 472 to add to or subtract from the image. In this way, image enhancement can be accomplished, or communications or other data can be superimposed on the display 300.

As noted above, the detector array 450 can comprise a Si charge coupled device, or if longer wavelength detection is required, can be made from p-i-n diodes formed from material in the InGaAs system. The array 450 is fabricated using substrate etch-off or lift-off processing, along with backside processing, to form very thin structures with metallization on both sides, as more fully described above in connection with the LED array 300.

The intensity of the image produced by array 300 may be controlled by varying the duty cycle timing or modulating the drive current of the LED pixels.

The electronics 470 consists of a multiplexing and sequencing circuit that first detects the charge or current in each IR detector, and then couples this input data to a current amplifier that drives the corresponding LED pixel in the output array 300. The electronic processor 470 also accepts signals from an external source, such as a microprocessor that can be displayed on the LED array. Moreover, the electronics can supply that video data to the microprocessor for image enhancement and can accept a return signal to be displayed on the LED array 300.

The LED array consists of multiplexed thin film LED pixels formed from material in the AlGaInP family, and more particularly, AlGaAs for bright red displays. The array is formed using the previously described processing array steps. The pixel size can be as small as 25 microns square and, consequently, the display can offer extremely high resolution or alternatively, fairly low cost.

As shown in FIG. 20, the detector 450 and LED array 300 can be stacked into a hybrid assembly comprised of a top thin film IR X-Y detector array 450 affixed by light transparent glue to lower thin film LED array 300 mounted on glass substrate 620. A glass lens 460 is affixed to the top surface of detector 450 and heat transfer openings 460 provided as necessary for cooling purposes. The entire structure can be quite thin (1 mil), with the electronics 470 provided around the periphery. Ultimately, the monolithic thin array can be mounted on ordinary glasses for image enhancement of visible light, as well as for display of data superimposed on video images.

The applications of the device of FIGS. 18–20 include military night vision systems, range finders, advanced military avionics, personal communications systems, and medical systems in which real-time image enhancement is useful.

As shown schematically in FIGS. 16 and 17, X-Y arrays can also be used to form a multicolor display. To make such a display, individual X-Y arrays labelled LED1, LED2 and LED3, are formed from two or more different epitaxial structures. The primary difference in the structure is in the active layer material 161, 162 and 163, which must have different band gaps to create different colors. For example, red 163 can be created with AlGaAs, and green 162 can be created with InAlGaP. The top device LED1 may be a blue LED formed of II–VI material, such as ZnSe, ZnSSe or a group IV alloy such as SiC.

The arrays must be stacked with the larger bandgap LED1 closer to the observer. The material with the larger bandgap will be transparent to the radiation from the smaller bandgap. Thus, in this way, the observer will be able to see both colors.

The creation of the stack of three LEDs 1020 is as follows: First, the three separate LED arrays LED1, LED2 and LED3 are formed, as previously described. Next, they are stacked together with glass 600 between them.

Transparent glue or epoxy 400 is used to bond the stacks on top of each other. The upper and lower bonding pads P1 and P2 on each LED are laterally staggered with respect to other LEDs, so that individual LED pixels may be addressed (See plan view FIG. 17).

An LED array, made in accordance with the above-described methods, can also be provided behind a lens or pushbutton, so that a message may be displayed. The message can be used to label the function of the pushbutton. The label and function may be assigned by a microprocessor.

Keyboards, pushbuttons and the like now dominate the interface between advanced microprocessor-based electronic instrumentation and the user. Commercial electronics and computers, such as work stations, avionics, telecommunications centers, and other advanced electronic systems, are limited by the functionality of the keyboard and button based interface. Even consumer and automotive electronics are beginning to reach the limits of the user/microprocessor interface.

For example, typical PC keyboards now employ as many as 20 re-assignable function keys, the purpose of which changes with each software package. It is not uncommon to see keyboards with numerous assignment stickers, templates, or other means of tracking the particular assignments of the keys. Even the alphabetical keys have numerous assignments. Obviously, the functionality of the various programs is becoming limited by the user's ability to handle numerous registers of multifunctional keys. In other electronic instruments, a similar problem exists. Modern medical instrumentation, for example, utilizes buttons that are positioned next to a cathode ray tube (CRT). The CRT is used to label the function of the buttons. The software determines the function of the button and the label to be displayed on the CRT, hence, the term "soft-key" has been used to describe this type of re-assignable button.

In many applications, buttons cannot be placed next to a CRT; the personal computer is a good example of such an application (nevertheless, some software packages label the buttons this way, but most users dislike the arrangement). In such a case, what is needed is a button that has an internal display capable of providing a label with a message provided by the resident active software.

In accordance with the invention, an X-Y LED array 966 is mounted within a pushbutton, as shown in FIG. 21. The X-Y array matrix is formed as previously described above in connection with FIGS. 14–17. The matrix is capable of providing two five letter words 980, or more, such as "DELAY", to identify the reassignable function of the pushbutton 960. The X-Y LED matrix 966 may be quite small, in order to be manufactured at a low cost. In such a case, the pushbutton also includes a small lens 964 that magnifies the image. Ideally, the electronics 968 that drive the X-Y array are located within the leadless chip carrier that houses the X-Y array 966. However, the electronics can also be located behind the array within the switch housing 970.

The front lens 962 or rear-projection screen, which also serves as the button, is mechanically attached by plunger 972 to a mechanical switch (not shown), so that when the surface of lens 962 is depressed by the user, a signal may be sent to a microprocessor (not shown).

Another embodiment which provides a wider viewing angle comprises the projection of the X-Y image onto a rear-projection screen; in such a case, the lens is positioned between the screen and the matrix. The screen is made of a plastic that transmits red light, so that the internal parts of the button are not visible, but which nevertheless transmits the image from the LEDs.

The smart switch button or message center should have numerous applications in advanced instrumentation and electronics. One main application will be in workstations in which a large number of reassignable function keys are needed. The second main application is on instrumentation in which front panel space is limited, such as in medical electronics and in avionics.

Equivalents

This completes the description of the preferred embodiments of the invention. Those skilled in the art may recognize other equivalent embodiments to those described herein; which equivalents are intended to be encompassed by the claims attached hereto. For example, while an OMCVD process is preferred for the reasons given above, molecular beam epitaxy (MBE) and chemical vapor deposition (CVD) and chemical beam epitaxy (CBE) based processes are also envisioned. Likewise, other types of material removal processes, in addition to chemical etching, such as reactive ion etching, are contemplated. Also, while an GaAs active layer has been described an AlGaAs layer can also be used wherein the aluminum percentage may vary from 0–38%.

We claim:

1. A method of forming thin film semiconductor devices having a front side and a back side comprising the steps of:
    a) forming a device precursor structure comprised of layers of thin film semiconductor material on a substrate with a release layer formed between the substrate and thin film layers;
    b) forming device contacts on the front side;
    c) forming a support member over and affixed to the front side film and device contacts;
    d) forming a plurality of openings through the support member and the thin film layer to the release layer;
    e) exposing the release layer to a release solution through the plurality of openings to remove a substantial portion of the release layer; and
    f) when a portion of the release layer is removed, removing the front side device precursor structure attached to the support member leaving an exposed back-side of the precursor structure for further processing.

2. The method of claim 1 wherein the support member is formed of material which undergoes thermal stress and bends when exposed to substantial variations in heat; and including the step of varying heat while the release layer is exposed to release solution whereby the support structure bends causing the front processed precursor structure to also bend, allowing greater access to the release layer for the release solution, thereby expediting removal of the release layer.

3. The method of claim 1 wherein the support member is comprised of transformable material which is transformable from a first state to a second state when exposed to increasing amounts of an external radiation stimuli.

4. The method of claim 3 wherein the stimuli is light radiation and the first state is an uncured, more soluble state and the second state is a cured, less soluble state.

5. The method of claim 4 wherein a light transparent photomask is formed over the support member with opaque regions where the openings are to be formed and non-opaque regions elsewhere, and including the steps of:
    a) projecting light upon the photomask to cure regions of transformable material below the non-opaque regions of photomask; and
    b) removing the photomask; and
    c) dissolving the support member in the uncured regions below the opaque regions of the photomask.

6. The method of claim 5 wherein the stimulus is UV light and the transformable material is UV sensitive epoxy.

7. The method of claim 2 wherein the support member is comprised of glass material.

8. A method of forming thin film LED semiconductor devices comprising the steps of:
    a) forming an LED device precursor structure comprised of epitaxial layers of III–V thin film semiconductor material on a substrate, with a release layer formed between the substrate and thin film layers, such film layers comprising a first cladding layer followed by an active layer with a p-n junction, followed by a second cladding layer, followed by a front side contact film;
    b) forming device contacts on the front side contact film;
    c) forming a support member over and affixed to the front side film and device contacts, and wherein the support member is comprised of transformable material which is transformable from a first state to a second state when exposed to increasing amounts of an external radiation stimuli;
    d) exposing the support member to the stimuli through a mask having a plurality of regions which are opaque with respect to the stimuli;
    e) forming a plurality of openings through the support member and the thin film layer to the release layer by dissolving the support member in regions underlying the opaque regions and using these dissolved regions to selectively remove thin film regions down to the release layer;
    f) exposing the release layer to a release solution through the plurality of openings to remove a substantial portion of the release layer; and
    g) when a portion of release layer is removed, lifting off the front side device precursor structure attached to the support member leaving an exposed back-side of the precursor structure exposed for further processing.

9. The method of claim 8 wherein the stimuli is light radiation and the first state is an uncured, more soluble state and the second state is a cured, less soluble state.

10. A method of forming thin film LED semiconductor devices comprising the steps of:
    a) forming an LED device precursor structure by forming layers of thin film III–V semiconductor material on a substrate with a release layer formed between the substrate and the thin film layers, a first such film layer comprising a back cladding layer, followed by an active layer having a p-n junction, followed by a front cladding layer, followed by a front side contact film;
    b) forming device contacts on the front side contact film;
    c) forming a support member over and affixed to the front side film and device contacts and wherein the support member is formed of material which undergoes thermal stress and bends when exposed to substantial variations in heat;
    d) forming a plurality of openings through the support member and the thin film layer to the release layer;
    e) exposing the release layer to a release solution through the plurality of openings to remove a substantial portion of the release layer and varying the heat whereby the support structure bends causing the front processed precursor structure to also bend, allowing greater access to the release layer for the release solution, thereby expediting removal of the release layer; and
    f) when a portion of release layer is removed, lifting off the front side device precursor structure attached to the support member leaving an exposed back-side of the precursor structure exposed for further processing.

11. A method of forming thin film semiconductor devices comprising the steps of:

a) forming device precursor structure(s) comprising layers of semiconductor material on a release layer formed on a substrate;

b) device processing a front side of the precursor structure including forming contacts on the precursor structure;

c) forming a layer of transformable material on the device processed front side, comprised of material which is transformable from an uncured, more soluble state, to a cured, less soluble state, by change in external stimuli;

d) forming a perforated support structure over the transformable layer;

e) forming a mask with regions opaque to said stimuli and aligning the opaque regions coincident with the perforations;

f) exposing the mask to the stimuli to cure regions of the transformable layer not underlying the opaque regions of the mask;

g) selectively dissolving the uncured regions of the transformable material beneath the perforations;

h) selectively removing regions of the precursor structure(s) underlying the dissolved uncured regions down to the release layer;

i) removing sufficient portions of the release layer to free the precursor structure(s) supported by the perforated support structure and cured transformable material; and j) device processing the backside of the supported structure(s) including forming at least one contact on the backside of the supported structure(s).

12. The method of claim 11 wherein the transformable material comprises light sensitive epoxy and the stimuli is light.

13. The method of claim 11 wherein the precursor structure(s) form a row of LEDs connected to individual busses.

14. The method of claim 11 wherein the precursor structure comprises an array of LEDs with front and back side contacts and wherein rows of front side contacts are connected to row busses and columns of back side contacts are connected to column busses.

15. The method of claim 12 wherein the transformable material is sensitive to ultraviolet light and the stimuli is ultraviolet light.

16. The method of claim 13 wherein the precursor structure(s) are formed of III–V cladding layers with an active light emitting layer between the cladding layers having a p-n junction formed of carbon doped III–V material as deposited by organometallic chemical vapor deposition.

17. The method of claim 14 wherein the precursor structure(s) are formed of III–V cladding layers with an active light emitting layer between the cladding layers having p-n junction formed of carbon doped III–V material as deposited by organometallic chemical vapor deposition.

18. The method of claim 11 including the step of forming a thin contact layer on the front side of the precursor structure(s) to spread current applied to the contacts.

19. The method of claim 18 wherein the contact layer is removed between precursor structure(s).

20. The method of claim 19 wherein the precursor structure(s) are LED structure(s) comprising an active light emitting layer sandwiched between cladding layers, with the cladding layer nearest the front side being sufficiently thin to form a high enough lateral resistance to prevent substantial current spreading beyond the edges of the remaining contact layers.

21. The method of forming thin film semiconductor devices comprising the steps of:

a) forming front side processed device precursor structure(s) of layers of semiconductor material formed on a release layer formed on a substrate;

b) forming channels in the precursor structure(s) for the flow of etchant to the release layer;

c) forming a support member on the processed precursor structure(s);

d) flowing etchant into the channels to remove release material so as to remove the substrate leaving the individual precursor structure(s) supported by the support member.

22. The method of claim 21 wherein a layer of UV curable epoxy is applied to the front side of the precursor structure before the channels are formed to increase the height of the channels.

23. The method of claim 21 wherein the precursor structure(s) are LED bars.

24. The method of claim 21 wherein the precursor structure(s) are X-Y addressable LED arrays.

25. The method of claim 21 wherein the support is formed of porous material and the etchant passes through the porous material to the channels without substantially etching the porous material.

26. The method of forming thin film semiconductor devices comprising the steps of a) forming front side processed device precursor structure(s) comprising layers of semiconductor material formed upon a release layer upon a substrate;

b) forming channels in the precursor structure(s) to the release layer;

c) exposing the release layer to an etchant;

d) forming a support member over the precursor structure(s) entrapping the etchant in the channels;

e) removing the release layer with the etchant; and f) separating the precursor structure(s) supported by the support member with each precursor structure registered with respect to each other.

27. The method of claim 26 including the step of back side processing the support member to form at least one contact on the support member.

28. The method of claim 27 wherein the precursor structure(s) are LEDs forming a row of pixels and the front side is processed to have individual front side contacts extending to individual bus bars and the back side is processed to have a common back side contact to form an LED bar.

29. The method of claim 27 wherein the precursor structure(s) are LEDs forming rows and column of pixels and the front side is processed to have each row connected to a bus bar and the back side is processed to have each column connected to a bus bar to form an LED X-Y addressable array.

30. The method of claim 26 wherein the support member comprises a light transparent medium adhered to two-sided light curable tape.

31. The method of claim 30 wherein the medium is alumina.

32. The method of claim 30 wherein the tape is used to transfer the precursor structure(s) to another support by being subjected to UV light to release the adherency of the tape.

33. A method of forming thin film semiconductor LED device(s) comprising the steps of:
   a) depositing thin film epitaxial layers on a suitable substrate to form LED precursor structure(s) with a contact film formed on the front side thereof;
   b) defining pixel regions over the films beneath which light emitting areas are located;
   c) removing epitaxial layer material between the pixel regions;
   d) forming an insulator film over remaining epitaxial layers and between the pixel regions;
   e) defining front contact areas over the epitaxial layers and removing the insulator film in the contact areas to expose the contact film in the contact areas;
   f) forming metal contacts on the contact film areas.

34. The method of claim 33 wherein the epitaxial layers include an active layer between front and back cladding layers and wherein the contact film enables current spreading over the pixel regions and the front cladding layer is sufficiently thin, so as to preclude substantial current spreading beyond the pixel regions.

35. A method of forming thin film semiconductor LED device(s) comprising the steps of:
   a) depositing thin film epitaxial layers on a suitable substrate to form LED precursor structure(s) with a thin contact film formed on the front side of the precursor structure(s);
   b) defining pixel regions over the films beneath which light emitting areas are located;
   c) damaging the crystallinity of the epitaxial layers between the light emitting areas to laterally isolate LED devices; and
   d) forming metallic front side and back side contacts on the devices.

36. The method of claim 35, in which the crystallinity is damaged by ion bombardement.

37. The method of claim 35 in which the LED device(s) are formed of III-V materials deposited by organometallic vapor deposition with an active layer having carbon doped p-n junction as grown.

38. A method of forming thin film semiconductor LED device(s) comprising the steps of:
   a) depositing thin film epitaxial layers on a suitable substrate to form LED precursor structure(s) with a thin contact film formed on the front side of the precursor structure(s);
   b) removing the contact film between the LED structures to define underlying LED pixel regions and exposing an underlying epitaxial layer between the pixel regions;
   c) anodizing the exposed areas to form an insulating oxide; and
   d) forming metal contacts on the front side contact film and on the back side of the LED structure(s).

39. The method of claim 38 wherein the epitaxial layers include a thin cladding layer underlying the contact film which has a high lateral resistance sufficient to preclude current spreading beyond the defined pixel regions.

40. The method of claim 38 wherein the thin contact film is in the order of 1000 Å, or less, and the cladding layer is in the order of 0.5 microns, or less.

41. The method of claim 34 wherein the front cladding layer is roughened and a back reflector is formed on the back cladding layer to enhance the probability of multiple reflections of light generated from the light emitting areas.

42. The method of claim 35 wherein the epitaxial layers include an active layer between front and back cladding layers and wherein the surface of the front cladding layer is corrugated and a back reflector is formed on the back cladding layers.

43. The method of claim 38 wherein the epitaxial layers include an active layer between front and back cladding layers and wherein the surface of the front cladding layer is corrugated and a back reflector is formed on the back cladding layers.

44. The method of claim 34 including back contacts formed on the back cladding layer and extending to the front side and co-planar with the front contacts.

45. The method of claim 42 including back contacts formed on the back cladding layer and extending to the front side and co-planar with the front contacts.

46. The method of claim 43 including back contacts formed on the back cladding layer and extending to the front side and co-planar with the front contacts.

47. A method of bonding LEDs to silicon wafers wherein an LED is formed in a III-V epitaxial layered film on a substrate and the substrate is removed and a eutectic solder is formed on the LED on the surface where the substrate was removed, comprising the steps of:
   disposing the LED on the silicon wafer with the eutectic solder contacting the silicon; and
   heating the solder to bond the LED to the wafer.

48. A method of forming a thin film semiconductor LED device having a front side from which light is emitted and a back side opposite the front side comprising the steps of:
   forming a semiconductor layer for an LED; and
   forming a cladding layer stacked relative to an active layer, the cladding layer having a roughened surface such that the roughened surface defines an exit angle of light emitted from the LED device.

49. The method of claim 48 wherein the step of forming a cladding layer comprises stacking a cladding layer on the front side of the active layer.

50. The method of claim 49 wherein the step of forming a cladding layer comprises roughening the front side of the cladding layer.

51. The method of claim 48 wherein the step of forming a cladding layer comprises stacking the cladding layer on the back side of the active layer.

52. The method of claim 48 further comprising the step of forming a light reflector on the back side of the LED device such that light propagating toward the back side of the LED device is reflected back toward the front side of the LED device.

53. The method of claim 52 wherein the step of forming a light reflector comprises forming a layer of aluminum.

54. The method of claim 52 wherein the step of forming a light reflector comprises forming a layer having a white diffused surface.

55. The method of claim 54 wherein the white diffused surface is magnesium oxide on a white ceramic material.

56. A method of forming a thin film semiconductor LED device having a front side from which light is emitted and a back side opposite the front side comprising the step of:
   forming a light reflector on the back side of the LED device such that light propagating toward the back side of the LED device is reflected back toward the front side of the LED device to positively affect the propagation of emitted light from the LED device.

57. The method of claim 56 wherein the step of forming a light reflector comprises forming a layer of aluminum.

58. The method of claim 56 wherein the step of forming a light reflector comprises forming a layer having a white diffused surface.

59. The method of claim 58 wherein the white diffused surface is magnesium oxide on a white ceramic material.

* * * * *